United States Patent
Chen et al.

(10) Patent No.: US 10,249,372 B2
(45) Date of Patent: Apr. 2, 2019

(54) REDUCING HOT ELECTRON INJECTION TYPE OF READ DISTURB IN 3D MEMORY DEVICE DURING SIGNAL SWITCHING TRANSIENTS

(71) Applicant: SanDisk Technologies LLC, Plano, TX (US)

(72) Inventors: Hong-Yan Chen, San Jose, CA (US);
Wei Zhao, Fremont, CA (US);
Ching-Huang Lu, Fremont, CA (US);
Yingda Dong, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/694,008

(22) Filed: Sep. 1, 2017

(65) Prior Publication Data

US 2019/0074062 A1    Mar. 7, 2019

(51) Int. Cl.
*G11C 16/08* (2006.01)
*G11C 16/04* (2006.01)
*G11C 16/10* (2006.01)
*G11C 16/16* (2006.01)

(52) U.S. Cl.
CPC .......... *G11C 16/08* (2013.01); *G11C 16/0483* (2013.01); *G11C 16/10* (2013.01); *G11C 16/16* (2013.01)

(58) Field of Classification Search
CPC .......... G11C 16/08; G11C 16/10; G11C 16/16
USPC ..................................... 365/185.11
See application file for complete search history.

(56) References Cited

U.S. PATENT DOCUMENTS

| | | | |
|---|---|---|---|
| 8,670,285 B2 | 3/2014 | Dong et al. | |
| 9,336,892 B1 | 5/2016 | Chen et al. | |
| 9,361,993 B1 | 6/2016 | Chen et al. | |
| 9,412,463 B1 | 8/2016 | Chen et al. | |
| 2013/0163336 A1* | 6/2013 | Li | G11C 16/0483 365/185.17 |

OTHER PUBLICATIONS

U.S. Appl. No. 15/383,852, filed Dec. 19, 2016, by Chen et al., entitled "Reducing Hot Electron Injection Type of Read Disturb During Read Recovery Phase in 3D Memory."

(Continued)

*Primary Examiner* — Jason Lappas
(74) *Attorney, Agent, or Firm* — Vierra Magen Marcus LLP

(57) ABSTRACT

A memory device and associated techniques for reducing read disturb of memory cells during a sensing process. Select gate transistors are transitioned to a conductive state one or more time during a sensing process, at the drain and/or source ends of the memory strings in an unselected sub-block. The transitioning can occur periodically, multiple times during the sensing process. When the select gate transistors are in a conductive state, accumulated holes in the channel can be removed. This help provide a faster decrease of the channel potential when the unselected word line voltages are ramped down at the end of the sensing process. The duration of a disturb-inducing channel gradient which is created next to the edge data memory cell is reduced so that read disturb of this cell is also reduced.

18 Claims, 17 Drawing Sheets

(56) References Cited

OTHER PUBLICATIONS

U.S. Appl. No. 15/172,653, filed Jun. 3, 2016, by Chen et al., entitled "Non-volatile Memory With Customized Control of Injection Type of Disturb During Program Verify for Improved Program Performance."

U.S. Appl. No. 15/678,683, filed Aug. 16, 2017, by Chen et al., entitled "Reducing Hot Electron Injection Type of Read Disturb in 3D Memory Device Having Connected Source-End Select Gates."

\* cited by examiner

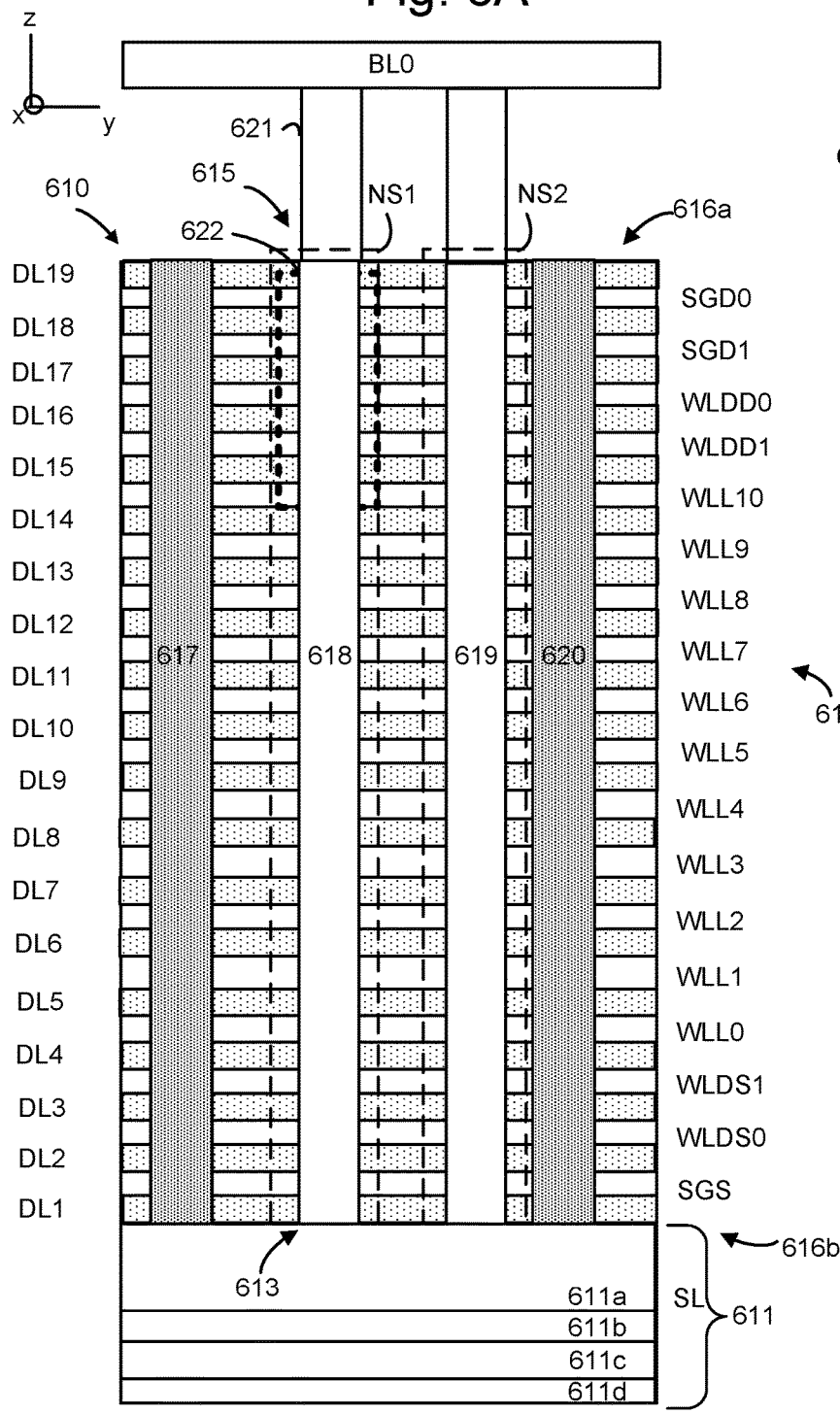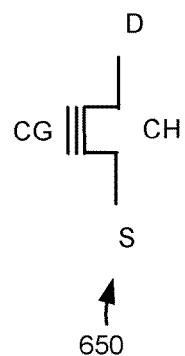

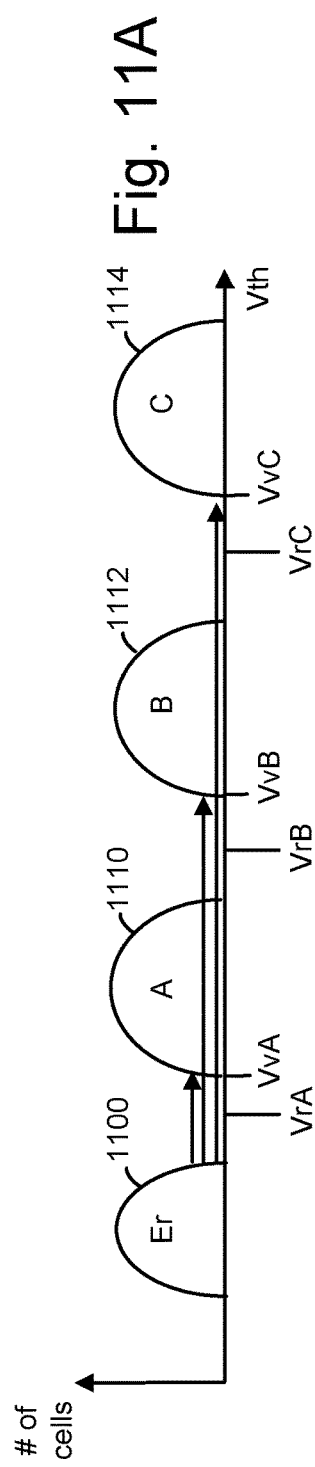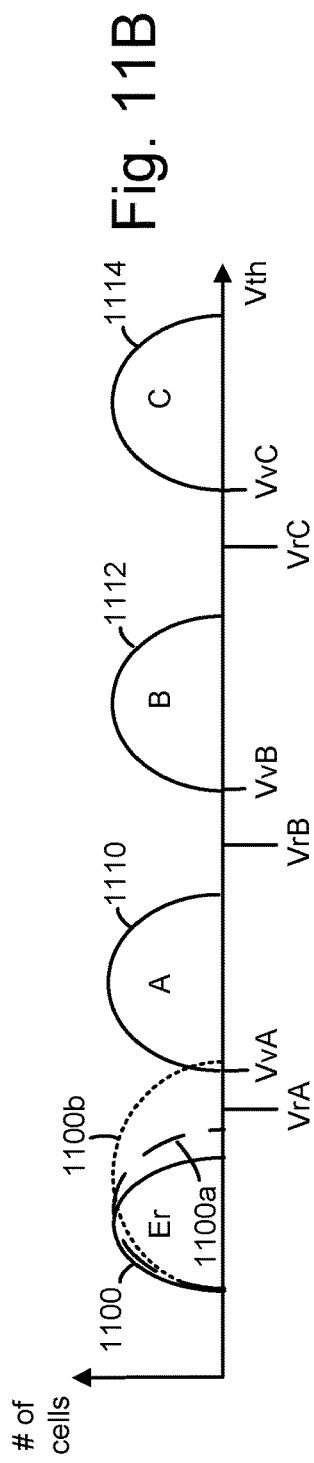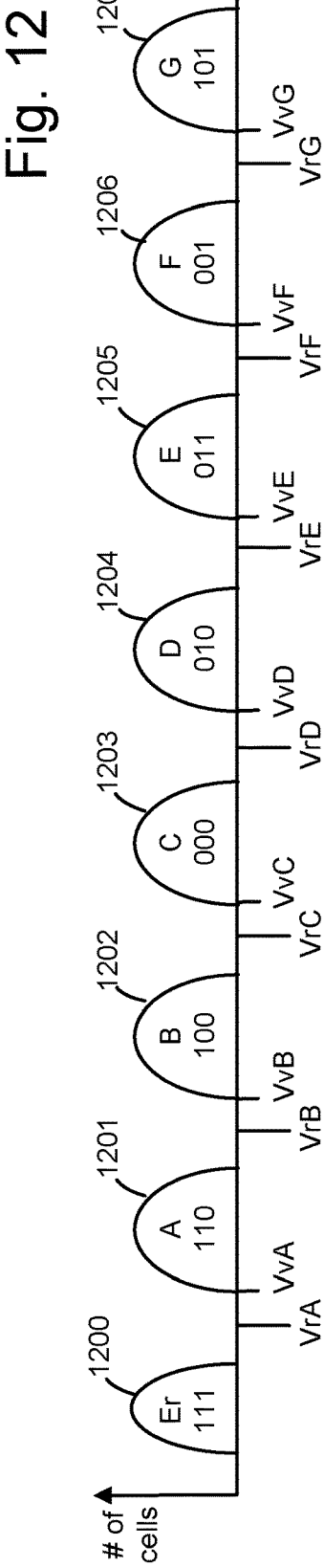

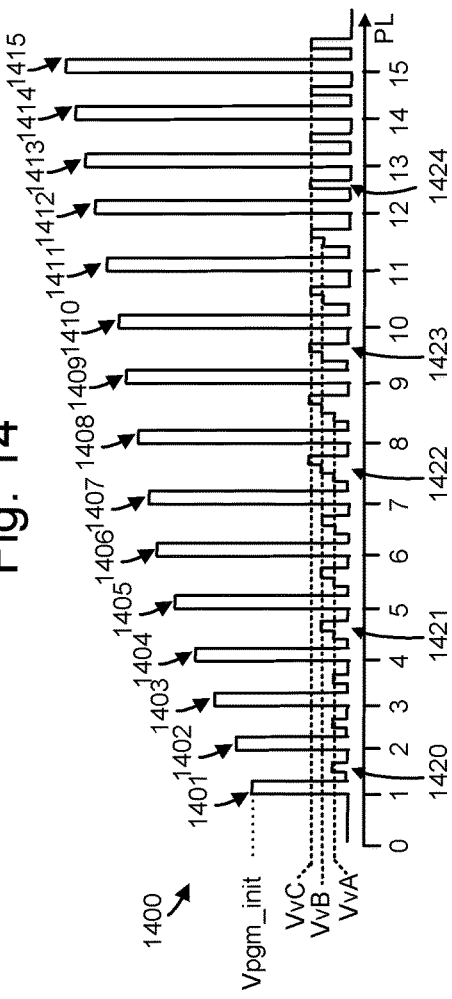
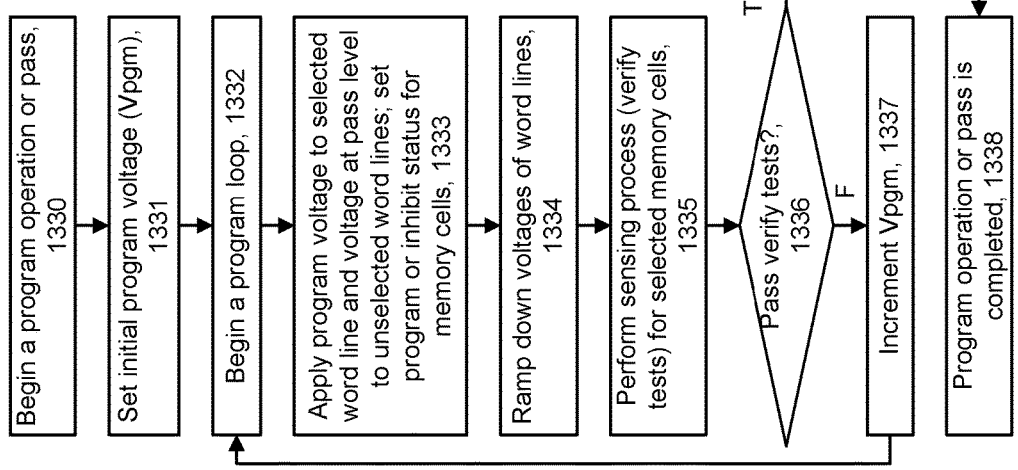

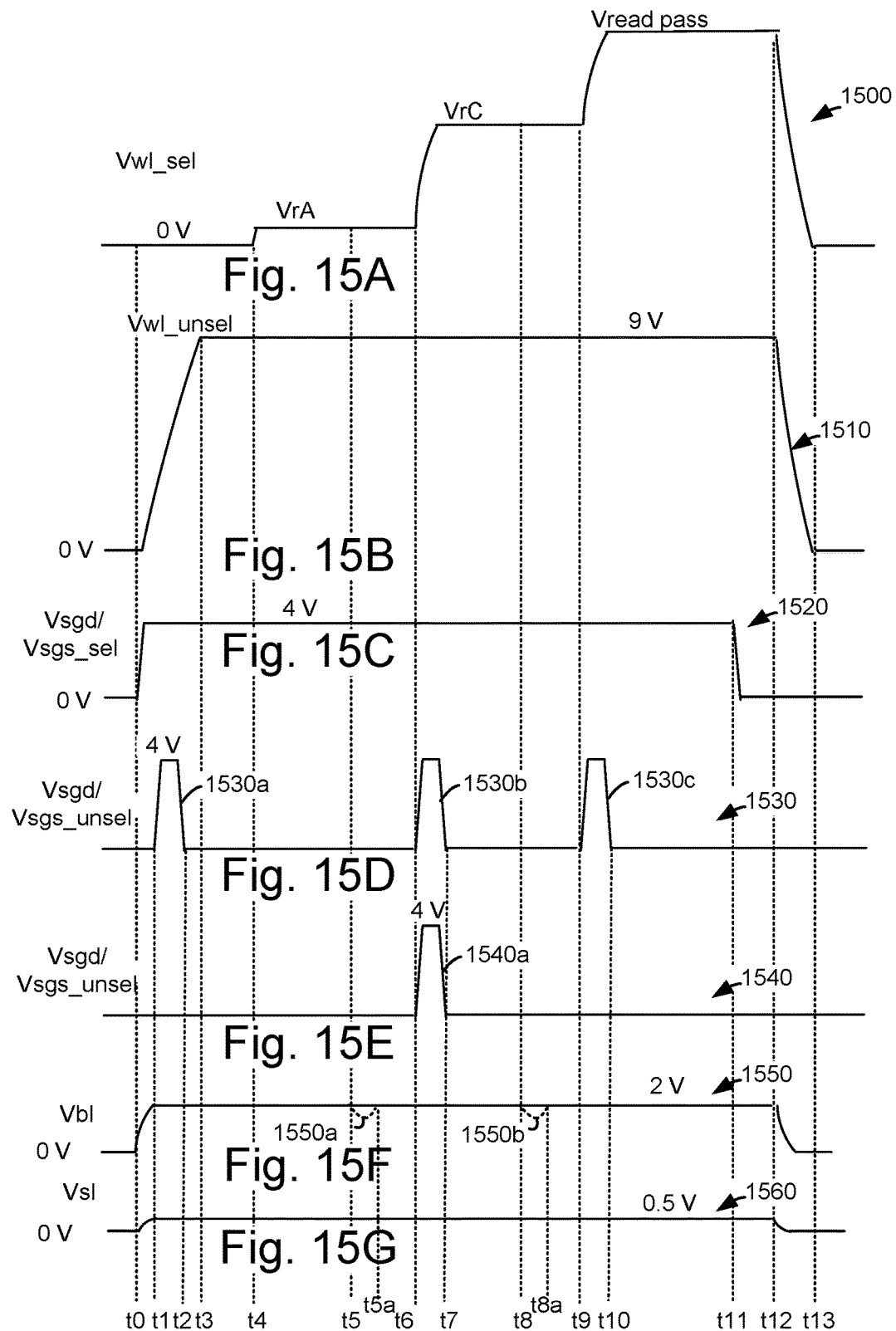

REDUCING HOT ELECTRON INJECTION TYPE OF READ DISTURB IN 3D MEMORY DEVICE DURING SIGNAL SWITCHING TRANSIENTS

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 6A depicts an example cross-sectional view of a portion of one of the blocks of FIG. 5.

FIG. 6B depicts an example transistor 650.

FIG. 11A depicts an example threshold voltage (Vth) distribution of a set of memory cells connected to a selected word line after a programming operation, where four data states are used.

FIG. 11B depicts an example Vth distribution of the set of memory cells of FIG. 11A, showing the effects of read disturb.

FIG. 12 depicts an example Vth distribution of a set of memory cells connected to a selected word line after a programming operation, where eight data states are used.

FIG. 13C depicts a flowchart of an example programming process which can use the sensing process of FIG. 13A when performing verify tests.

FIG. 14 depicts a series of program loops in an example programming operation, consistent with FIG. 13C.

FIG. 15A to 15G depicts example plots of voltages used in the sensing process of FIG. 13A.

FIG. 15A depicts an example plot 1500 of a voltage on a selected word line, Vwl_sel.

FIG. 15B depicts an example plot 1510 of a voltage on unselected word lines, Vwl_unsel.

FIG. 15C depicts an example plot 1520 of a voltage on SGD and SGS transistors in a selected sub-block, Vsgd_sel and Vsgs_sel, respectively.

FIG. 15D depicts an example plot 1530 of a voltage on SGD and SGS transistors in an unselected sub-block, Vsgd_unsel and Vsgs_unsel, respectively, where three transitions to a conductive state are used.

FIG. 15E depicts an example plot 1540 of a voltage on SGD and SGS transistors in an unselected sub-block, Vsgd_unsel and Vsgs_unsel, respectively, where one transition to a conductive state is used.

FIG. 15F depicts an example plot 1550 of a voltage on a bit line, Vbl.

FIG. 15G depicts an example plot 1560 of a voltage on a source line, Vsl.

DETAILED DESCRIPTION

Figure 1:
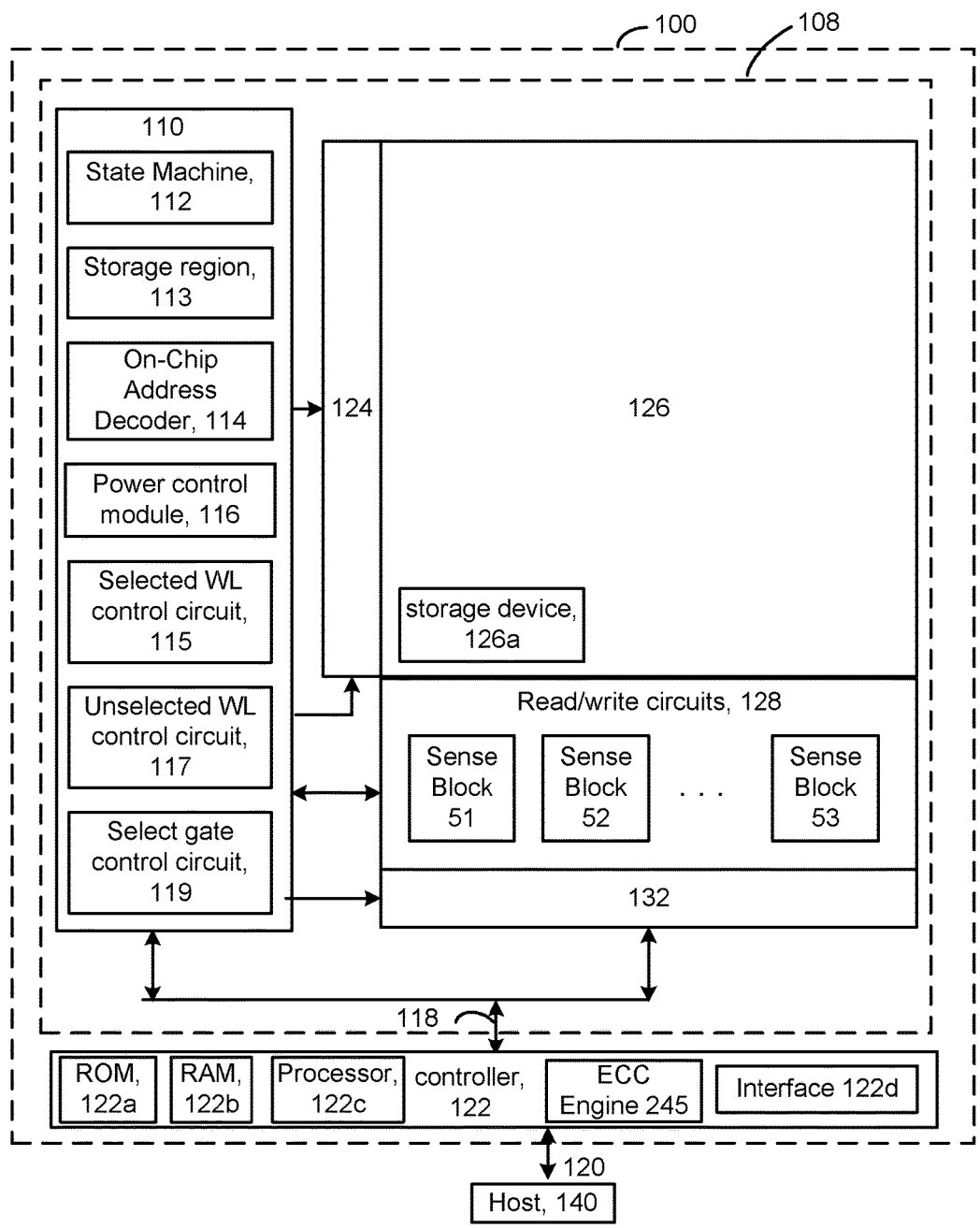
FIG. 1 is a block diagram of an example memory device.

Apparatuses and techniques are described for reducing read disturb in a memory device.

In some memory devices, memory cells are joined to one another such as in NAND strings in a block or sub-block. Each NAND string comprises a number of memory cells connected in series between one or more drain-end select gate (SG) transistors (referred to as SGD transistors), on a drain-end of the NAND string which is connected to a bit line, and one or more source-end SG transistors (referred to as SGS transistors), on a source-end of the NAND string or other memory string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical memory strings in a stack, where the stack comprises alternating conductive and dielectric layers. The conductive layers act as word lines which are connected to the memory cells. Each memory string may have the shape of a pillar which intersects with the word lines to form the memory cells.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in the channel voltage gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 14. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to write data in a program command. Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states (see FIG. 11A). In a three-bit per cell memory device, there are eight data states including the erased state and seven higher data states referred to as the A, B, C, D, E, F and G data states (see FIG. 12). In a four-bit per cell memory device, there are sixteen data states including the erased state and fifteen higher data states. The data states may be referred to as the S0-S15 data states where S0 is the erased state.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage levels of adjacent data states. During the read operation, the voltages of the unselected word lines are ramped up to a read pass level which is high enough to place the unselected memory cells in a strongly conductive state, to avoid interfering with the sensing of the selected memory cells.

However, the Vth of the memory cells, especially the erased state cells, can be increased by read disturb. One type of read disturb is caused by weak Fowler-Nordheim (F-N) tunneling due to a large voltage difference between the control gate and the channel of a cell. One countermeasure is to boost the channel voltages of the memory strings. Another type of read disturb is hot electron injection (HEI) type of read disturb. In this case, a channel gradient generates electron-hole pairs in which electrons can be injected into the charge trapping layer of a memory cell, increasing its Vth. The boosting of the channel, if not uniform, can sometimes increase the likelihood of the injection type of disturb.

The likelihood of the injection type of disturb is also a function of the position of a memory cell in a string. In particular, the edge data memory cells, which are close to the select gate transistors at the ends of the unselected memory strings, can be disturbed when the unselected word line voltages are ramped down at the end of a sensing process. For example, refer to the edge data memory cell 857 in FIG. 10A which is at the drain end of the memory string 710n. For the unselected memory strings, the select gate transistors are typically turned off (made non-conductive) to avoid interfering with the sensing of current in the selected memory strings. This also allow the channels of the unselected memory strings (see channel 710a in FIG. 10A) to be boosted by the ramp up of the unselected word line voltages at the start of the sensing process, to combat FN type disturb.

When a select gate transistor is non-conductive, a channel gradient (see plot 940d in FIG. 10A) can be created between the select gate transistor and an adjacent memory cell, which can be a dummy or data memory cell. The channel gradient results in electron-hole generation, where the holes can be accumulated in shallow traps in the channel adjacent to the select gate transistor. When the unselected word line voltages are ramped down, electrons inside the channel tend to move toward the selected gate and recombine with the accumulated holes (see FIG. 10B). This slows the decrease of the channel potential adjacent to the memory cells. Further, when the edge data memory cell 857 become non-conductive, a disturb-inducing channel gradient (see plot 950f in FIG. 10B) is created next to the edge data memory cell. This gradient causes a disturb of the cell 857.

Techniques provided herein address the above and other issues. In one aspect, the select gate transistors are transitioned to a conductive state one or more times during a sensing process. For example, see the transitions 1530*a*, 1530*b* and 1530*c* in FIG. 15D and the transition 1540*a* in FIG. 15E. The transitioning can occur at the drain and/or source ends of the memory strings in an unselected sub-block. In some cases, the transitioning occurs periodically, multiple times during the sensing process. When the select gate transistors are in a conductive state, the accumulated holes in the channel can be removed. This helps provide a faster decrease of the channel potential (Vch) when the unselected word line voltages are ramped down at the end of the sensing process. For example, see plot 1800 in FIG. 18A which shows a faster decrease than plot 1801. FIG. 18B shows the ramp down of the unselected word line voltage, Vwl_unsel. The duration of the disturb-inducing channel gradient which is created next to the edge data memory cell is reduced so that read disturb of this cell is also reduced.

The transitions can occur while a control gate read voltage is applied to the selected word line and a read pass voltage is applied to the unselected word lines. The transitions can be timed so that they do not interfere with sensing of memory strings in a selected sub-block. The number of transitions and the duration of a transition can be set based on factors such as the amount of read stress.

These and other features are discussed further below.

FIG. 1 is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, a power control module 116, a selected word line (WL) control circuit 115, an unselected word line control circuit 117, and a select gate control circuit 119. The selected WL control circuit can be used to set voltages on a selected word line (Vwl_sel such as in FIG. 15A), the unselected WL control circuit can be used to set voltages on unselected word lines (Vwl_unsel such as in FIG. 15B), and the select gate control circuit can be used to set voltages on select gate transistors including SGD and SGS transistors (Vsgd/sgs_sel and Vsgd/sgs_unsel such as in FIG. 15C to 15E). In some cases, the circuit 119 controls SGD and SGS transistors separately for each sub-block, or separately for selected and unselected sub-blocks. These circuits 115, 117 and 119, among other circuits, may be used during a sensing operation as described herein.

The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122*c*, storage devices (memory) such as ROM 122*a* and RAM 122*b* and an error-correction code (ECC) engine 245. The ECC engine can correct a number of read errors.

A memory interface 122*d* may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122*d*.

The storage device comprises code such as a set of instructions, and the processor is operable to execute the set of instructions to provide the functionality described herein. Alternatively or additionally, the processor can access code from a storage device 126*a* of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122*c* fetches the boot code from the ROM 122*a* or storage device 126*a* for execution, and the boot code initializes the system components and loads the control code into the RAM 122*b*. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
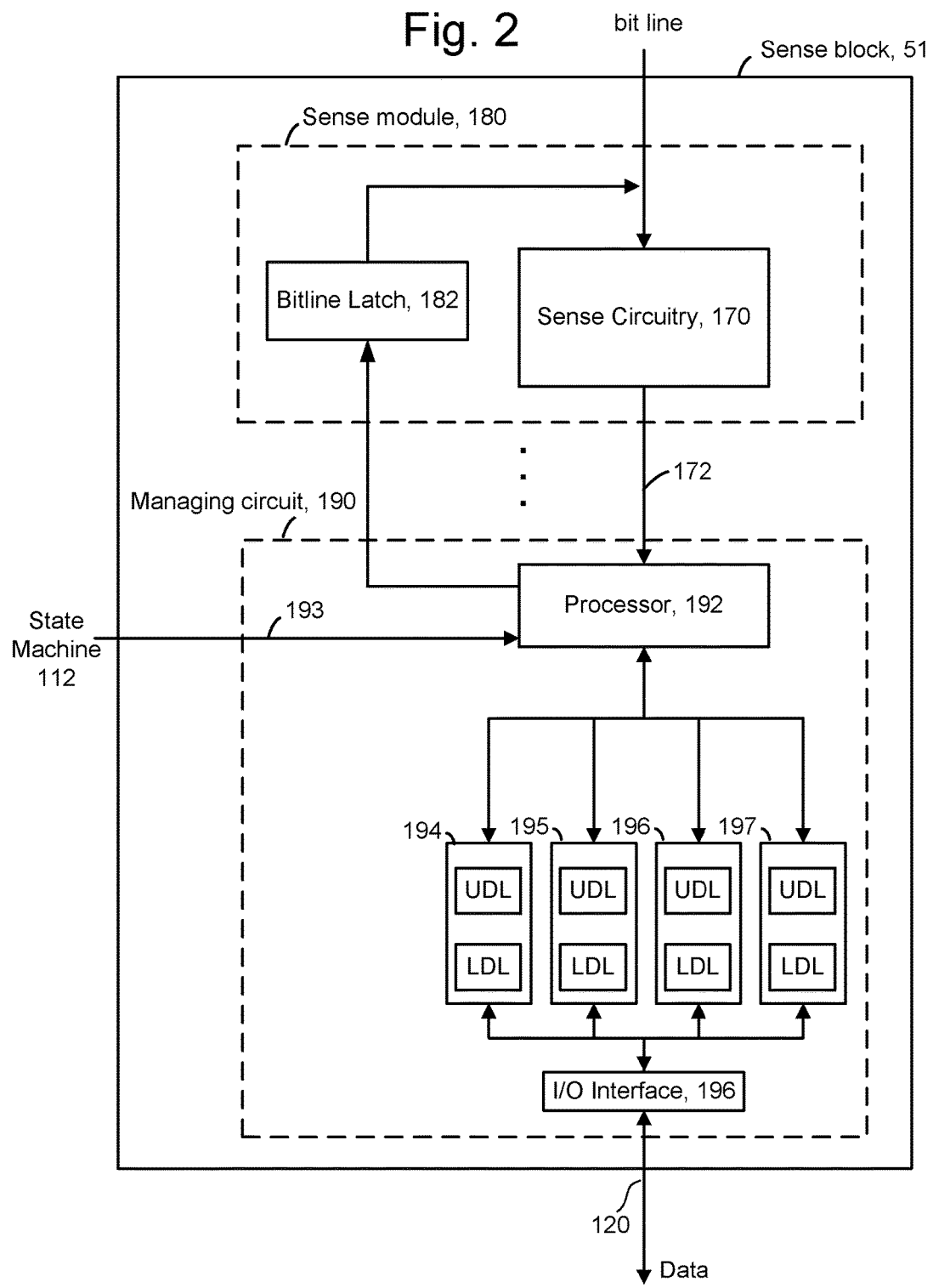
FIG. 2 is a block diagram depicting one embodiment of the sense block 51 of FIG. 1.

FIG. 2 is a block diagram depicting one embodiment of the sense block 51 of FIG. 1. An individual sense block 51 is partitioned into one or more core portions, referred to as sense modules 180 or sense amplifiers, and a common portion, referred to as a managing circuit 190. In one embodiment, there will be a separate sense module 180 for each bit line and one common managing circuit 190 for a set of multiple, e.g., four or eight, sense modules 180. Each of the sense modules in a group communicates with the associated managing circuit via data bus 172. Thus, there are one or more managing circuits which communicate with the sense modules of a set of storage elements.

Sense module 180 comprises sense circuitry 170 that performs sensing by determining whether a conduction current in a connected bit line is above or below a predetermined threshold level. Sense module 180 also includes a bit line latch 182 that is used to set a voltage condition on the connected bit line. For example, a predetermined state latched in bit line latch 182 will result in the connected bit line being pulled to a state designating program inhibit (e.g., 1.5-3 V). As an example, a flag=0 can inhibit programming, while flag=1 does not inhibit programming.

Managing circuit 190 comprises a processor 192, four example sets of data latches 194-197 and an I/O Interface 196 coupled between the set of data latches 194 and data bus 120. One set of data latches can be provide for each sense module, and data latches identified by LDL and UDL may be provided for each set. In some cases, additional data latches may be used. LDL stores a bit for a lower page of data, and UDL stores a bit for an upper page of data. This is in a four-level or two-bits per storage element memory device. One additional data latch per bit line can be provided for each additional data bit per storage element.

Processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a programming operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed storage element. As it steps through the various predefined control gate voltages corresponding to the various memory states supported by the memory, the sense module 180 may trip at one of these voltages and a corresponding output will be provided from sense module 180 to processor 192 via bus 172. At that point, processor 192 determines the resultant memory state by consideration of the tripping event(s) of the sense module and the information about the applied control gate voltage from the state machine via input lines 193. It then computes a binary encoding for the memory state and stores the resultant data bits into data latches 194-197. In another embodiment of the managing circuit 190, bit line latch 182 serves double duty, both as a latch for latching the output of the sense module 180 and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LDL and UDL latches, in a two-bit per storage element implementation. In a three-bit per storage element implementation, an additional data latch may be used. The programming operation, under the control of the state machine, comprises a series of programming voltage pulses applied to the control gates of the addressed storage elements. Each program pulse is followed by a read back (verify) to determine if the storage element has been programmed to the desired memory state. In some cases, processor 192 monitors the read back memory state relative to the desired memory state. When the two are in agreement, the processor 192 sets the bit line latch 182 so as to cause the bit line to be pulled to a state designating program inhibit. This inhibits the storage element coupled to the bit line from further programming even if program pulses appear on its control gate. In other embodiments the processor initially loads the bit line latch 182 and the sense circuitry sets it to an inhibit value during the verify process.

Each set of data latches 194-197 may be implemented as a stack of data latches for each sense module. In one embodiment, there are three data latches per sense module 180. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

The data latches identify when an associated storage element has reached certain mileposts in a programming operations. For example, latches may identify that a storage element's Vth is below a particular verify level. The data latches indicate whether a storage element currently stores one or more bits from a page of data. For example, the LDL latches can be used to store a lower page of data. An LDL latch is flipped (e.g., from 0 to 1) when a lower page bit is stored in an associated storage element. A UDL latch is flipped when an upper page bit is stored in an associated storage element. This occurs when an associated storage element completes programming, e.g., when its Vth exceeds a target verify level such as VvA, VvB or VvC.

Figure 3:
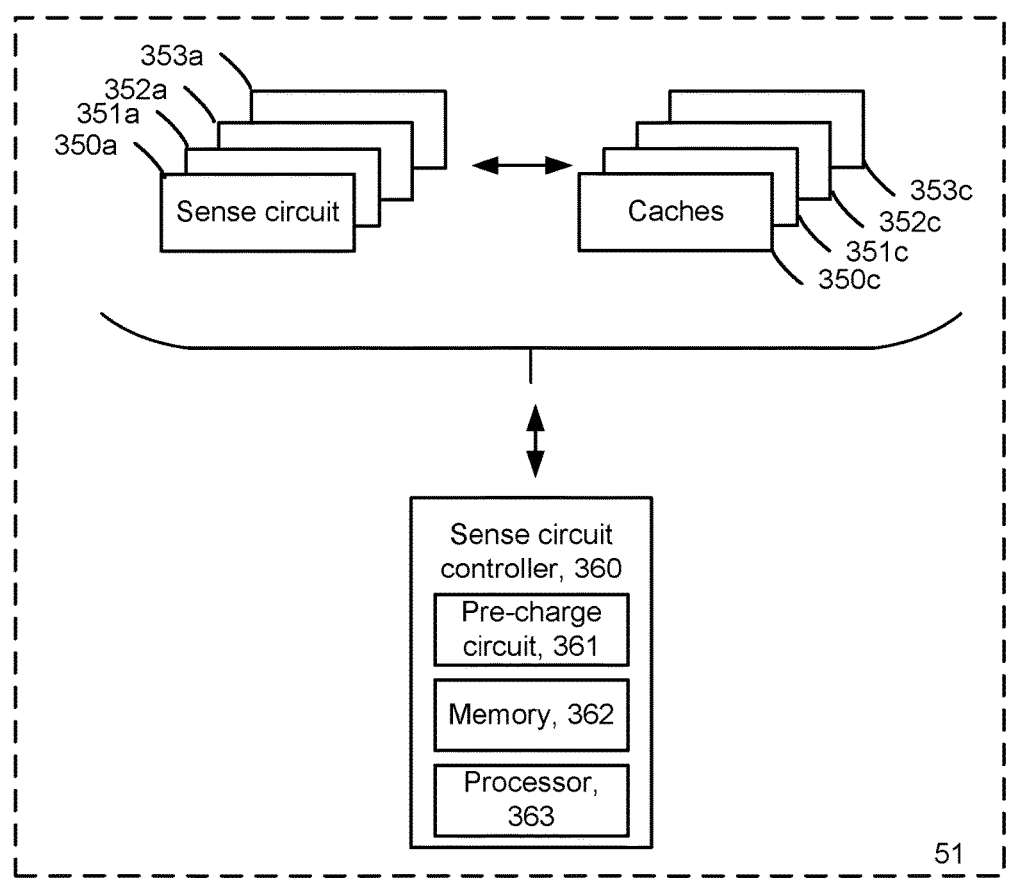
FIG. 3 depicts another example block diagram of the sense block 51 of FIG. 1.

FIG. 3 depicts another example block diagram of the sense block 51 of FIG. 1. The column control circuitry can include multiple sense blocks, where each sense block performs sensing, e.g., read, program verify or erase verify operations for multiple memory cells via respective bit lines. In one approach, a sense block comprises multiple sense circuits, also referred to as sense amplifiers. Each sense circuit is associated with data latches and caches. For example, the example sense circuits 350a, 351a, 352a and 353a are associated with caches 350c, 351c, 352c and 353c, respectively.

In one approach, different subsets of bit lines can be sensed using different respective sense blocks. This allows the processing load which is associated with the sense circuits to be divided up and handled by a respective processor in each sense block. For example, a sense circuit controller 360 can communicate with the set, e.g., sixteen, of sense circuits and latches. The sense circuit controller may include a pre-charge circuit 361 which provides a voltage to each sense circuit for setting a pre-charge voltage. The sense circuit controller may also include a memory 362 and a processor 363.

Figure 4:
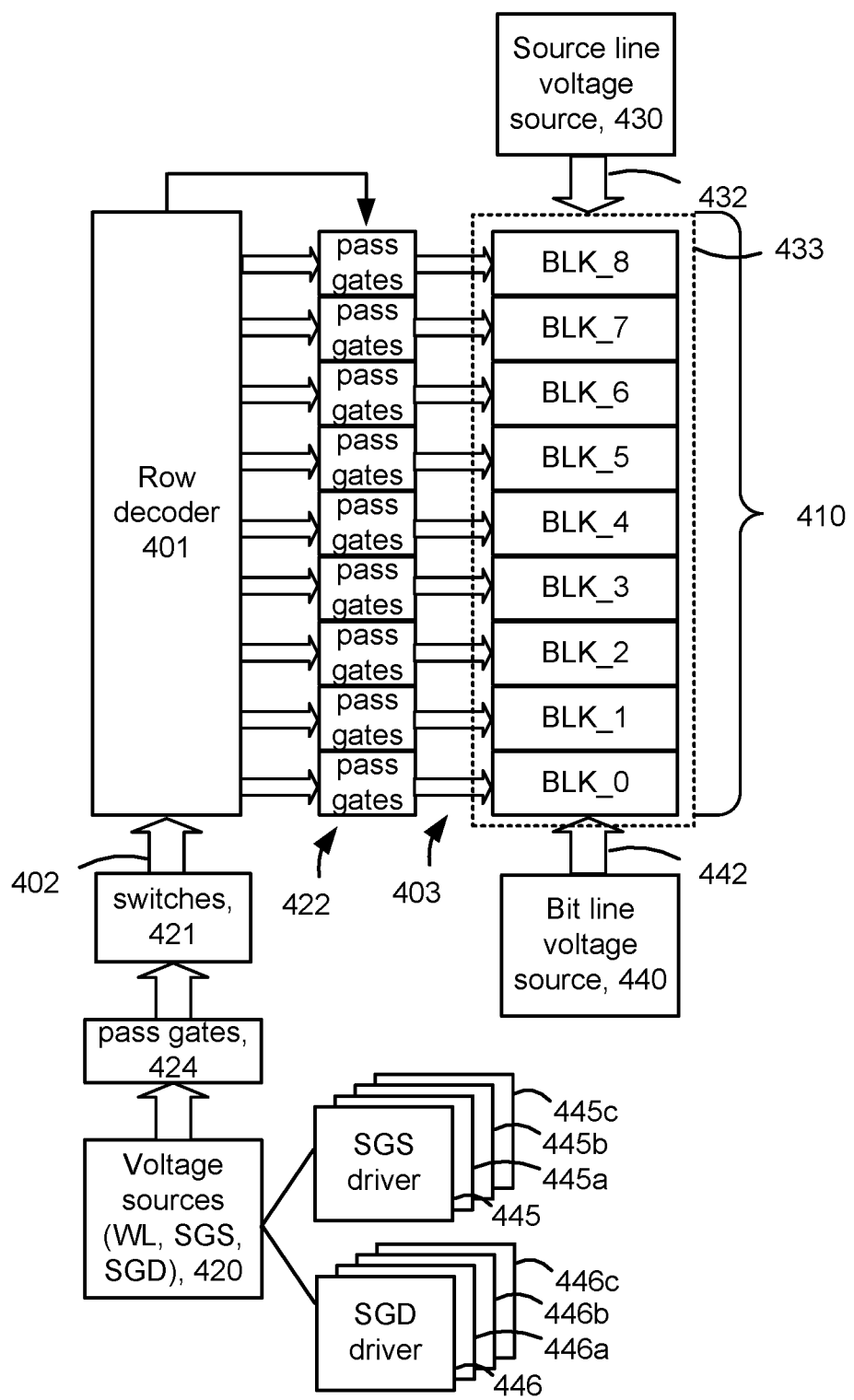
FIG. 4 depicts an example circuit for providing voltages to blocks of memory cells.

FIG. 4 depicts an example circuit for providing voltages to blocks of memory cells. In this example, a row decoder 401 provides voltages to word lines and select gates of each block in set of blocks 410. The set could be in a plane and includes blocks BLK_0 to BLK_8. The row decoder provides a control signal to pass gates 422 which connect the blocks to the row decoder. Typically, operations, e.g., program, read or erase, are performed on one selected block at a time. The row decoder can connect global control lines 402 to local control lines 403. The control lines represent conductive paths. Voltages are provided on the global control lines from voltage sources 420. The voltage sources may provide voltages to switches 421 which connect to the global control lines. Pass gates 424, also referred to as pass transistors or transfer transistors, are controlled to pass voltages from the voltage sources 420 to the switches 421.

The voltage sources 420 can provide voltages on word lines (WL), SGS control gates and SGD control gates, for example. Specifically, the voltage sources 420 can include separate SGS and SGD drivers for each sub-block. For example, SGS drivers 445, 445a, 445b and 445c, and SGD drivers 446, 446a, 446b and 446c can be provided for SB0, SB1, SB2 and SB3, respectively, such as in FIGS. 7 and 8.

The various components, including the row decoder, may receive commands from a controller such as the state machine 112 or the controller 122 to perform the functions described herein.

A source line voltage source 430 provides the voltage Vsl to the source lines/diffusion region in the substrate via control lines 432. In one approach, the source diffusion region 433 is common to the blocks. A set of bit lines 442 is also shared by the blocks. A bit line voltage source 440 provides voltages to the bit lines. In one possible implementation, the voltage sources 420 are near the bit line voltage source.

Figure 5:
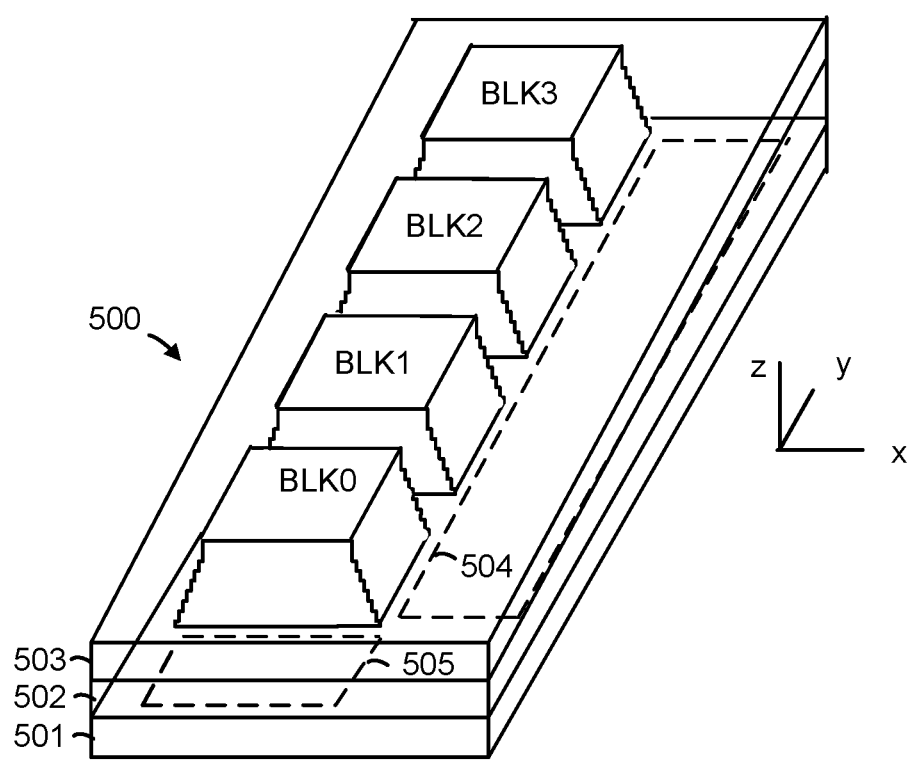
FIG. 5 is a perspective view of a memory device 500 comprising a set of blocks in an example 3D configuration of the memory structure 126 of FIG. 1.

FIG. 5 is a perspective view of a memory device 500 comprising a set of blocks in an example 3D configuration of the memory structure 126 of FIG. 1. On the substrate are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The pass gates for a voltage source of the SGS transistors may be located in this peripheral area 505, in one approach. In this case, the blocks BLK0, BLK1, BLK2 and BLK3 are at progressively further distances from the pass gates. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 6C:
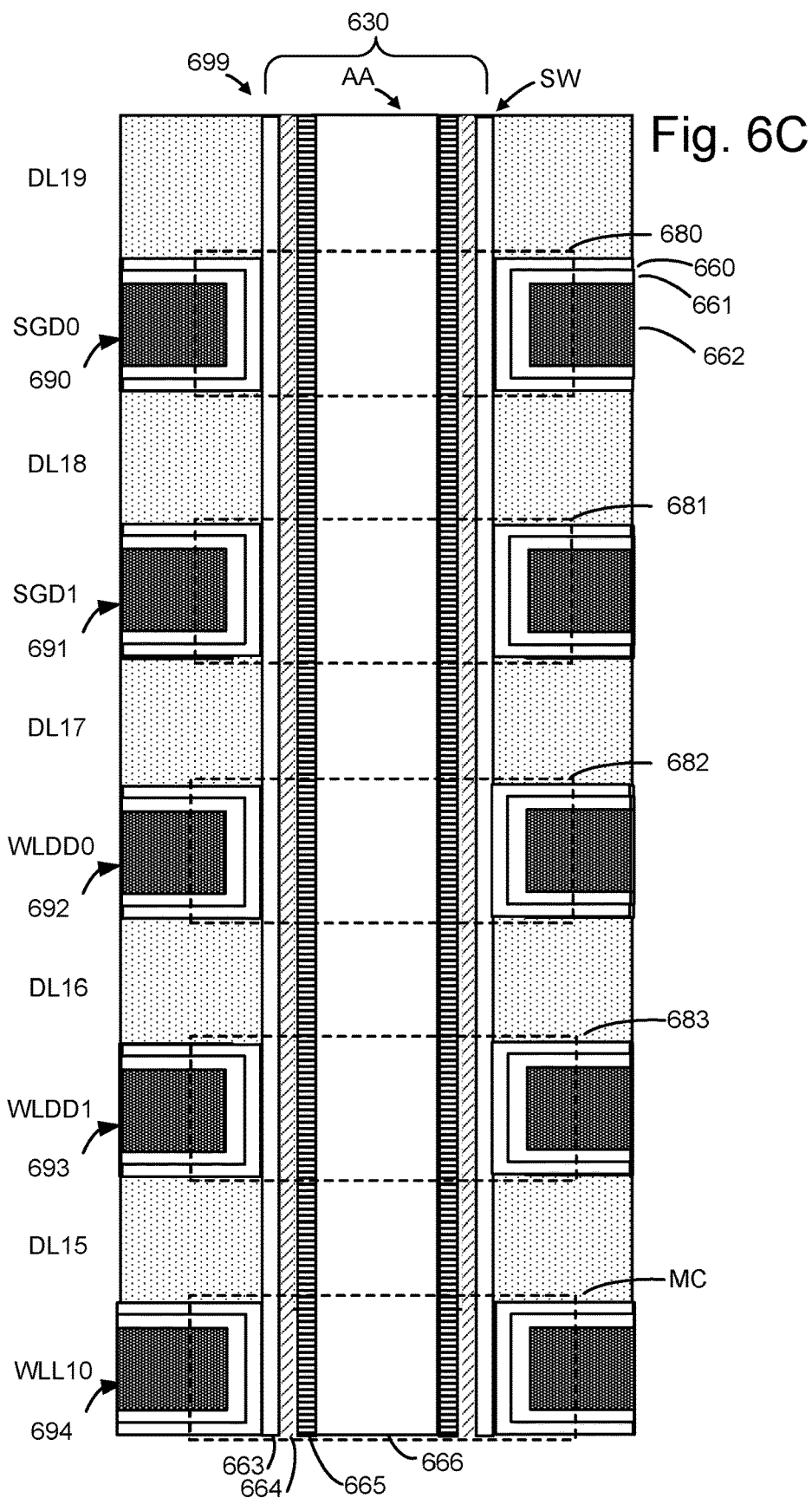
FIG. 6C depicts a close-up view of the region 622 of the stack of FIG. 6A.

FIG. 6A depicts an example cross-sectional view of a portion of one of the blocks of FIG. 5. The block comprises a stack 610 of alternating conductive and dielectric layers. In this example, the conductive layers comprise two SGD layers, one SGS layer, two source side dummy word line layers (or word lines) WLDS1 and WLDS0, two drain side dummy word line layers WLDD1 and WLDD0, and eleven data word line layers (or data word lines) WLL0-WLL10. WLL0 is a source side data word line and WLDS1 is a dummy word line layer which is adjacent to the source side data word line. WLDS0 is another dummy word line layer which is adjacent to WLDS1. WLL10 is a drain side data word line and WLDD1 is a dummy word line layer which is adjacent to the drain side data word line. WLDD0 is another dummy word line layer which is adjacent to WLDD1. The dielectric layers are labelled as DL1-1L19. Further, regions of the stack which comprise NAND strings NS1 and NS2 are depicted. Each NAND string encompasses a memory hole 618 or 619 which is filled with materials which form memory cells adjacent to the word lines. Region 622 of the stack is shown in greater detail in FIG. 6C.

The stack includes a substrate 611. In one approach, a portion of the source line SL comprises an n-type source diffusion layer 611a in the substrate which is in contact with a source end of each string of memory cells in a block. The n-type source diffusion layer 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NS1 has a source-end 613 at a bottom 616b of the stack 616 and a drain-end 615 at a top 616a of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage sources.

FIG. 6B depicts an example transistor 650. The transistor comprises a control gate CG, a drain D, a source S and a channel CH and may represent a memory cell or a select gate transistor, for example.

FIG. 6C depicts a close-up view of the region 622 of the stack of FIG. 6A. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each pillar 699 or column which is formed by the materials within a memory hole can include a charge-trapping layer 663 or film such as silicon nitride (Si3N4) or other nitride, a tunneling layer 664, a channel 665 (e.g., comprising polysilicon), and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each memory string comprises a channel which extends continuously from the source-end select gate transistor to the drain-end select gate transistor.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 7:
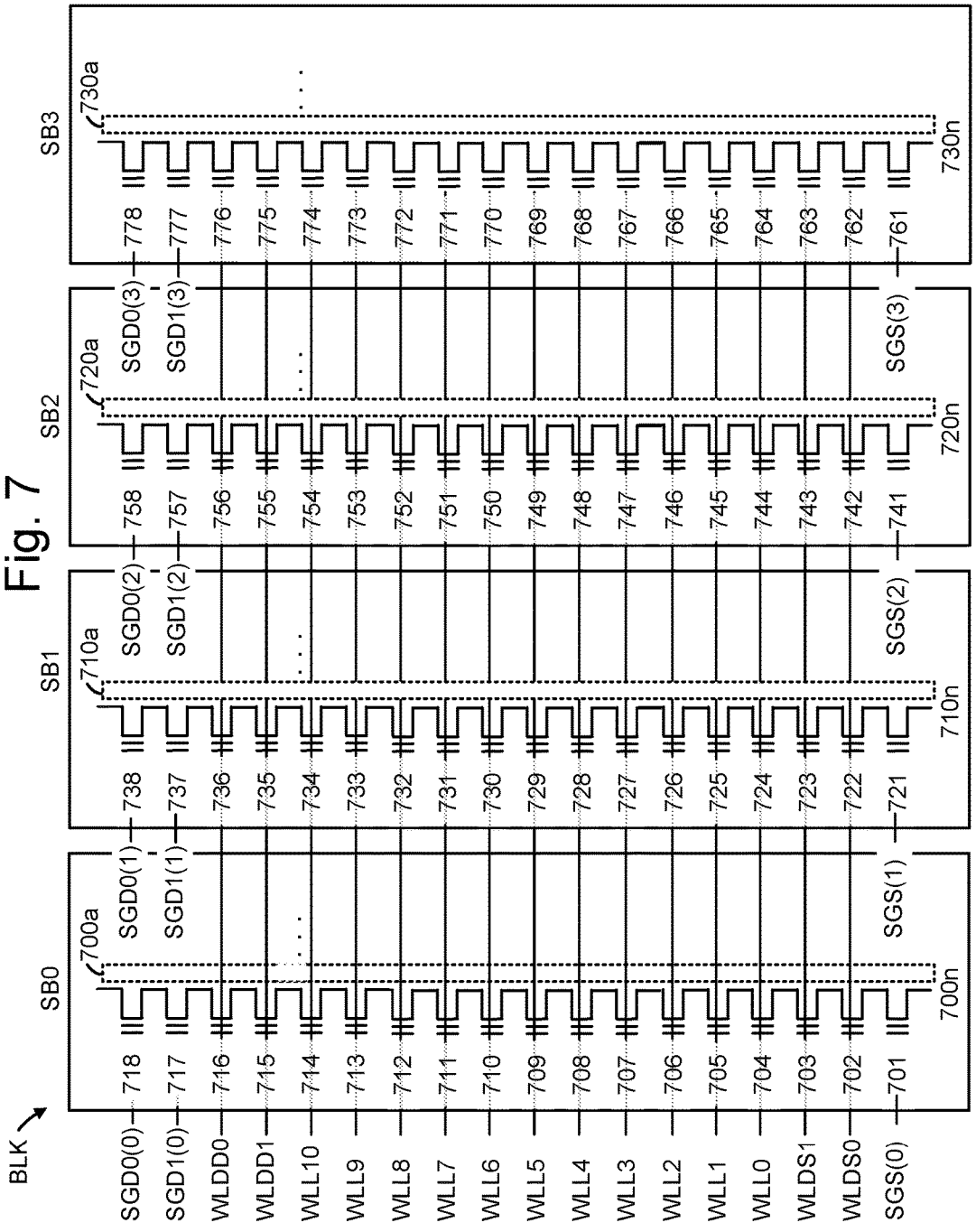
FIG. 7 depicts an example view of NAND strings in sub-blocks in a 3D configuration which is consistent with FIG. 6A.

FIG. 7 depicts an example view of NAND strings in sub-blocks in a 3D configuration which is consistent with FIG. 6A. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6A. In a block BLK, each sub-block comprises a set of NAND strings which extend in the x direction and which have a common SGD line. The NAND strings 700n, 710n, 720n and 730n are in sub-blocks SB0, SB1, SB2 and SB3, respectively. Programming of the block may occur one sub-block at a time. Within each sub-block, a word line programming order may be followed, e.g., starting at WL0, the source-end word line and proceeding one word line at a time to WLL10, the drain-end word line.

The NAND strings 700n, 710n, 720n and 730n have channels 700a, 710a, 720a and 730a, respectively.

Additionally, NAND string 700n includes SGS transistor 701, dummy memory cells 702 and 703, data memory cells 704, 705, 706, 707, 708, 709, 710, 711, 712, 713 and 714, dummy memory cells 715 and 716, and SGD transistors 717 and 718.

NAND string 710n includes SGS transistor 721, dummy memory cells 722 and 723, data memory cells 724, 725, 726, 727, 728, 729, 730, 731, 732, 733 and 734, dummy memory cells 735 and 736, and SGD transistors 737 and 738.

NAND string 720n includes SGS transistor 741, dummy memory cells 742 and 743, data memory cells 744, 745, 746, 747, 748, 749, 750, 751, 752, 753 and 754, dummy memory cells 755 and 756, and SGD transistors 757 and 758.

NAND string 730n includes SGS transistor 761, dummy memory cells 762 and 763, data memory cells 764, 765, 766, 767, 768, 769, 770, 771, 772, 773 and 774, dummy memory cells 775 and 776, and SGD transistors 777 and 778.

One or more SGD transistors are provided at the drain-end of each memory string, and one or more SGS transistors are provided at the source-end of each memory string. The SGD transistors in SB0, SB1, SB2 and SB3 may be driven by separate control lines SGD0(0) and SGD1(0), SGD0(1) and SGD1(1), SGD0(2) and SGD1(2), and SGD0(3) and SGD1(3), respectively. The SGS transistors in SB0, SB1, SB2 and SB3 may be driven by control lines SGS(0), SGS(1), SGS(2) and SGS(3), respectively.

Figure 8:
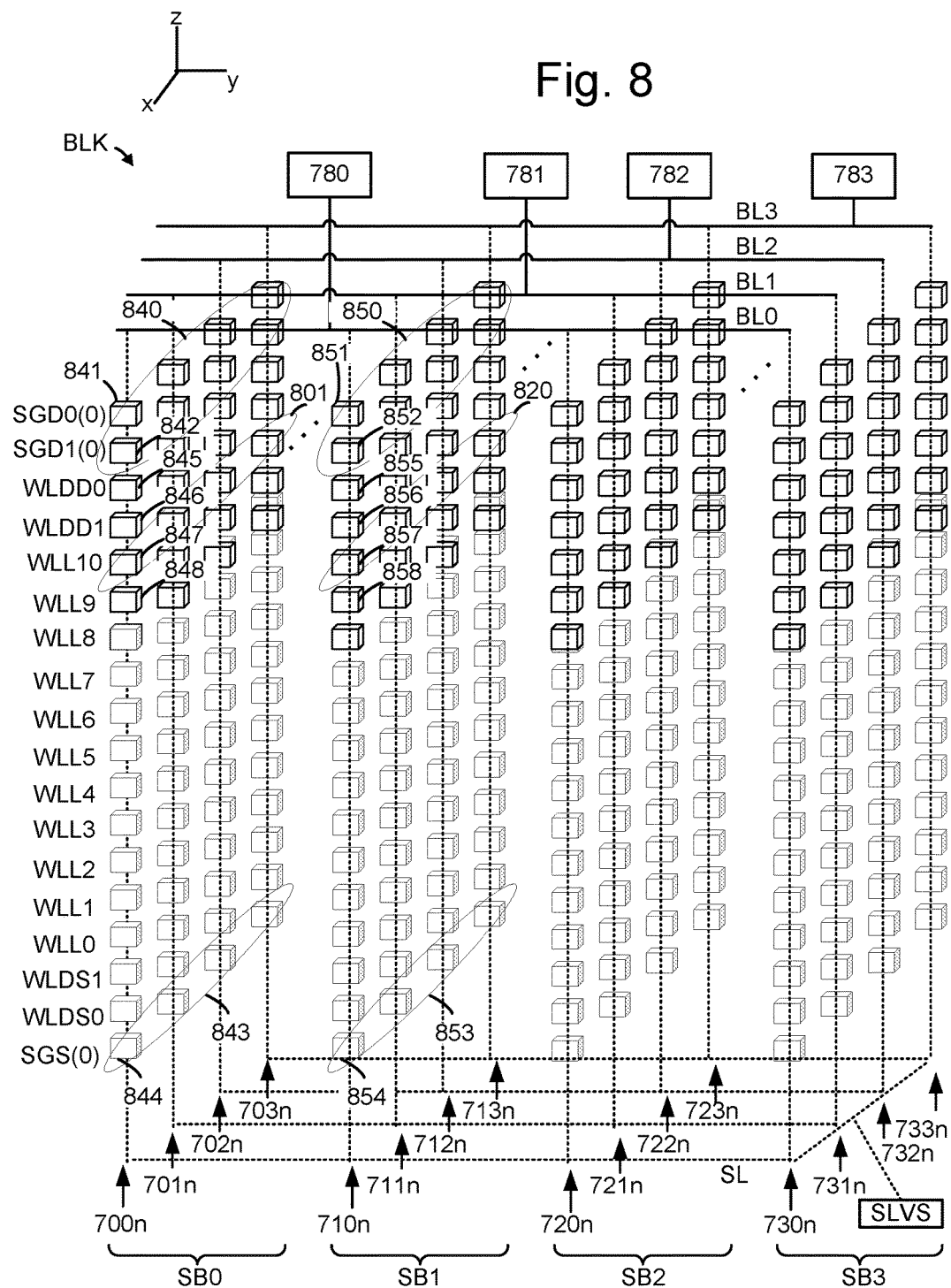
FIG. 8 depicts additional detail of the sub-blocks SB0-SB3 of FIG. 7.

FIG. 8 depicts additional detail of the sub-blocks SB0-SB3 of FIG. 7. Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. Sensing circuitry may be connected to each bit line. For example, sensing circuitry 780, 781, 782 and 783 is connected to bit lines BL0, BL1, BL2 and BL3. A bit line voltage source may be provided with the sensing circuitry.

Programming and reading can occur for selected cells in one word line and one sub-block at a time. This allows each selected cell to be controlled by a respective bit line and/or source line. For example, a set of memory cells 801, which includes an example memory cell 847, is connected to WLL10 in SB0. This is the drain-end or drain-edge data word line. WLL0 is the source-end or source-edge data word line. A set of memory cells may be programmed or read concurrently. An additional set of memory cells is connected to WLL10 in each of the other sub-blocks SB1-SB3. For example, a set of memory cells 820, which includes an example memory cell 857, is connected to WLL10 in SB1.

When the memory cells of WLL9 in SB0 are sensed, such as in a read operation or a verify test, the cells of WLL10 in SB1-SB3 are most susceptible to read disturb as described herein. The memory cells being sensed are the selected memory cells, the associated word line is a selected word line or word line layer and the associated sub-block is a selected sub-block. At this time, the memory cells not being sensed are the unselected memory cells (in SB0 on all word lines except WLn and in SB1-SB3 on all word lines). The word lines other than WLL9 are the unselected word lines or word line layers. The notations WLn, WLn−1 and WLn+1 may be used to represent a selected word line, an adjacent source-end unselected word line, and an adjacent drain-end unselected word line, respectively.

In this example, the source line SL or source region is driven at a voltage Vsl by a voltage source, SLVS.

Each memory string includes one or more SGD transistors at the drain-end and one or more SGS transistors at the source end. In this case, there are two SGD transistors and one SGS transistor per string. Each SGD transistor may be connected to separate control line layer, as in FIG. 7, so that it can be driven separately, or the two or more SGD transistors in a string may have their control gates connected and commonly driven. For example, SB0 has a set of SGD transistors 840, with example SGD transistors 841 and 842 in the memory string 700n. SB0 also has a set of SGS transistors 843, with an example SGS transistor 844 in the memory string 700n. Similarly, SB1 has a set of SGD transistors 850, with example SGD transistors 851 and 852 in the memory string 710n. SB1 also has a set of SGS transistors 853, with an example SGS transistor 854 in the memory string 710n.

The string 700n includes SGD transistors 841 and 842 connected to select gate control lines SGD0(0) and SGD1(0), respectively, dummy memory cells 845 and 846 connected to dummy word lines WLDD0 and WLDD1, respectively, and data memory cells 847 and 848 connected to data word lines WLL10 and WLL9, respectively. See also FIG. 9A to 9C. The string 710n includes SGD transistors 851 and 852 connected to select gate control lines SGD0(1) and SGD1(1) (see FIG. 7), respectively, dummy memory cells 855 and 856 connected to dummy word lines WLDD0 and WLDD1, respectively, and data memory cells 857 and 858 connected to data word lines WLL10 and WLL9, respectively. See also FIGS. 10A and 10B.

Figure 9A:
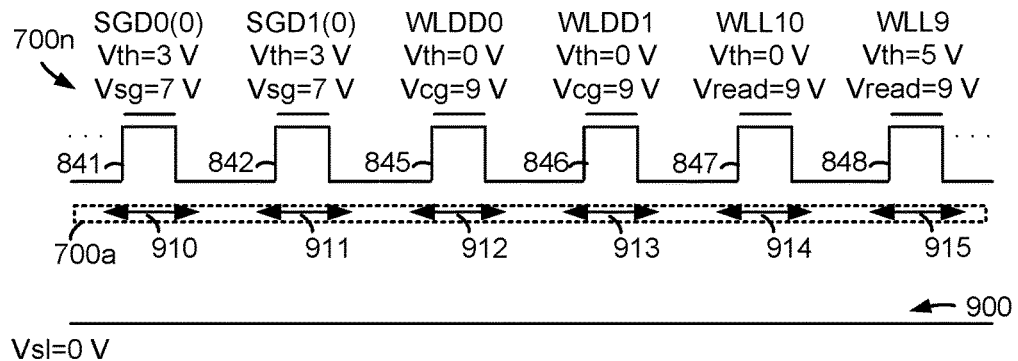
FIG. 9A depicts a plot of a channel voltage versus memory string position for a selected string, when a read pass voltage is applied to unselected word lines and a turn on voltage is applied to the select gate transistors of the selected string.

FIG. 9A depicts a plot of a channel voltage versus memory string position for a selected string, when a read pass voltage is applied to unselected word lines and a turn on voltage is applied to the select gate transistors of the selected string. The scenario corresponds to t11 in FIG. 15A to 15G. A turn on voltage of a select gate transistor is a voltage which exceeds the Vth of the transistor, for instance.

Figure 9B:
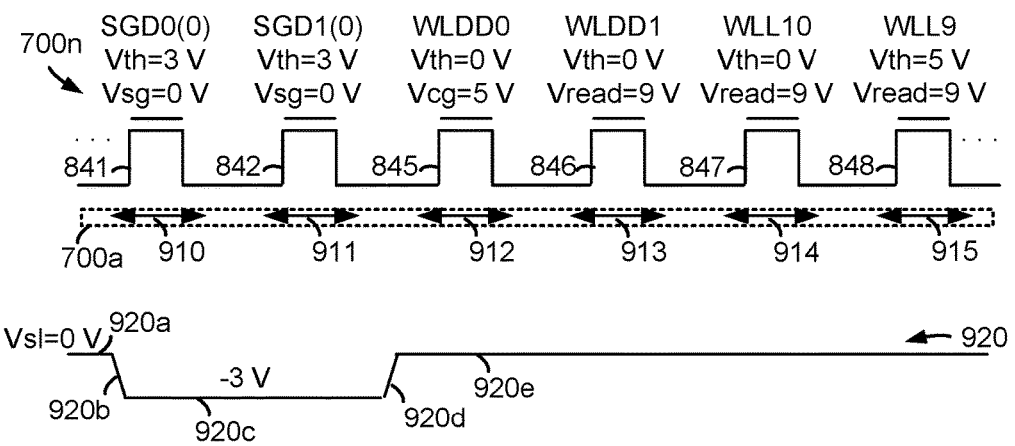
FIG. 9B depicts a plot of a channel voltage versus memory string position for a selected string after the scenario in FIG. 9A, when the voltages are ramped down on the select gate transistors of the selected string.
Figure 9C:
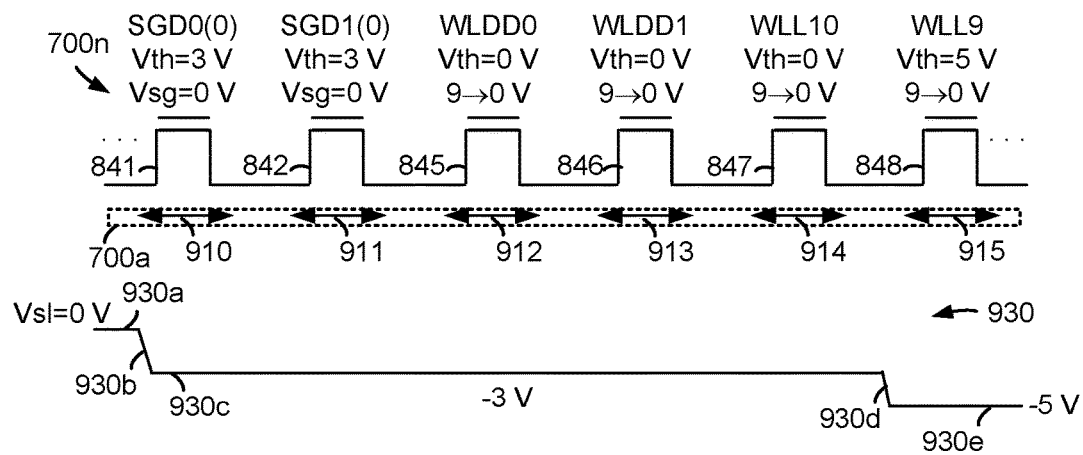
FIG. 9C depicts a plot of a channel voltage versus memory string position for a selected string after the scenario in FIG. 9B, when the voltages are ramped down on the selected and unselected word lines.

In FIG. 9A to 9C, a portion of the memory string 700n and its channel 700a of FIGS. 7 and 8 is depicted. The portion of the memory string shown includes the SGD transistors 841 and 842 connected to SGD0(0) and SGD1(0), respectively, the dummy memory cells 845 and 846 connected to WLDD0 and WLDD1, respectively, and the data memory cells 847 and 848 connected to WLL10 and WLL9, respectively. The remaining data memory cells and the SGS transistor extend to the right in the figure. The channel voltage waveforms in FIG. 9A to 9C can be a mirror image with respect to the drain and source ends, in one approach.

The problem of read disturb as addressed herein mainly impacts the edge data word lines on both the drain and source sides, and can occur for any position of the selected word line. The drain side is focused on here but a similar situation may be present on the source side. In the selected memory string 700n, the SGD transistors 841 and 842 are adjacent to channel portions 910 and 911, respectively. The dummy memory cells 845 and 846 are adjacent to channel portions 912 and 913, respectively. The data memory cells 847 and 848 are adjacent to channel portions 914 and 915, respectively. Note that the use of dummy memory cells is optional. Two drain-end dummy memory cells are provided as an example.

A plot 900 represents a magnitude of the channel voltage for the different channel portions. The plot is approximately a flat line at about 0 V in this case since the source line voltage Vsl and the bit line voltage Vbl are communicated throughout the channel. In one approach, Vsl=0 V and Vbl=0.5-2 V so there could be a very mild gradient across the entire channel. The select gate transistors and memory cells are all in a conductive state at this point.

Each select gate transistor or memory cell has a threshold voltage (Vth) and a control gate or word line voltage. Typical values can include a Vth=3 V for the SGD transistors and Vth=0 V for the dummy memory cells. The Vth of a data memory cell can vary based on whether the cell is programmed, and if it is programmed, based on its data state. Generally, the programming of the cells is random so that a memory string will have cells in different states. However, a worst case scenario can be considered in which the memory cell 848 (the data memory cell adjacent to the drain edge data memory cell 847) is in the highest programmed state (e.g., with Vth=5 V) and the drain edge data memory cell 847 is in the erased state (e.g., with Vth=0 V). Further, assume that the voltages on SGD0(0) and SGD1(0) are Vsg=7 V, the voltages on WLDD0 and WLDD1 are Vread=9 V and the voltages on WLL10 and WLL9 are also at Vread=9 V (e.g. Vread pass). Each transistor has a control gate voltage which exceeds it Vth so the transistor is in a conductive state.

FIG. 9B depicts a plot of a channel voltage versus memory string position for a selected string after the scenario in FIG. 9A, when the voltages are ramped down on the select gate transistors of the selected string. The scenario corresponds to just after t11 in FIG. 15A to 15G, when the select gate transistors in the selected sub-block ramp down to 0 V. The SGD transistors 841 and 842 become non-conductive, and the associated channel regions have a bias of about −3 V which is equal to the control gate voltage minus the Vth. The dummy and data memory cells remain in a conductive state.

A plot 920 represents a magnitude of the channel voltage for the different channel portions. A plot portion 920a shows that the voltage is 0 V at the drain end. A plot portion 920c shows that the voltage is −3 V adjacent to the SGD transistors, as mentioned. A plot portion 920e shows that the voltage is 0 V adjacent to the dummy and data memory cells. Plot portions 920b and 920d represent channel gradients. These gradients are relatively small and do not lead to read disturb.

FIG. 9C depicts a plot of a channel voltage versus memory string position for a selected string after the scenario in FIG. 9B, when the voltages are ramped down on the selected and unselected word lines. The scenario corresponds to t12-t13 in FIG. 15A to 15G, when the voltages on the selected and unselected word lines ramp down from Vread, e.g., 9 V, to a lower level such as 0 V. This results in the channels portions of the memory cells 845-848 becoming non-conductive. The low point of the channel voltage is adjacent to WLL9, where the voltage is about −5 V based on the control gate voltage minus the Vth. A small channel gradient is created between WLL10 and WLL9 as represented by the plot portion 930d. This gradient is relatively small and does not lead to read disturb.

A plot 930 represents a magnitude of the channel voltage for the different channel portions. A plot portion 930a shows that the voltage is 0 V at the drain end. A plot portion 930c shows that the voltage is −3 V adjacent to the SGD transistors and the dummy memory cells. A plot portion 920e shows that the voltage is 0 V adjacent to the dummy memory cells 845 and 846 and the data memory cell 847. Plot portions 930b and 930d represent channel gradients. These gradients are relatively small and do not lead to read disturb.

Figure 10A:
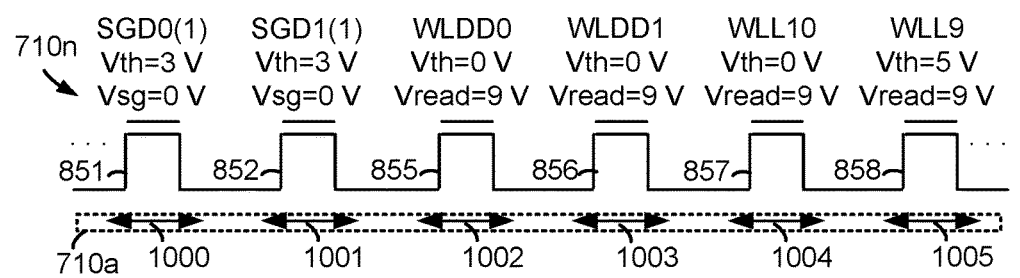
FIG. 10A depicts a plot of a channel voltage versus memory string position for an unselected string, when a read pass voltage is applied to unselected word lines and a cutoff voltage is applied to the select gate transistors of the unselected string.

FIG. 10A depicts a plot of a channel voltage versus memory string position for an unselected string, when a read pass voltage is applied to unselected word lines and a cutoff voltage is applied to the select gate transistors of the unselected string. This situation can be compared with the situation in FIG. 9A and corresponds to the time period t3-t12 in FIG. 15A to 15G. The dummy and data word line voltages are the same as in FIG. 9A.

Figure 10B:
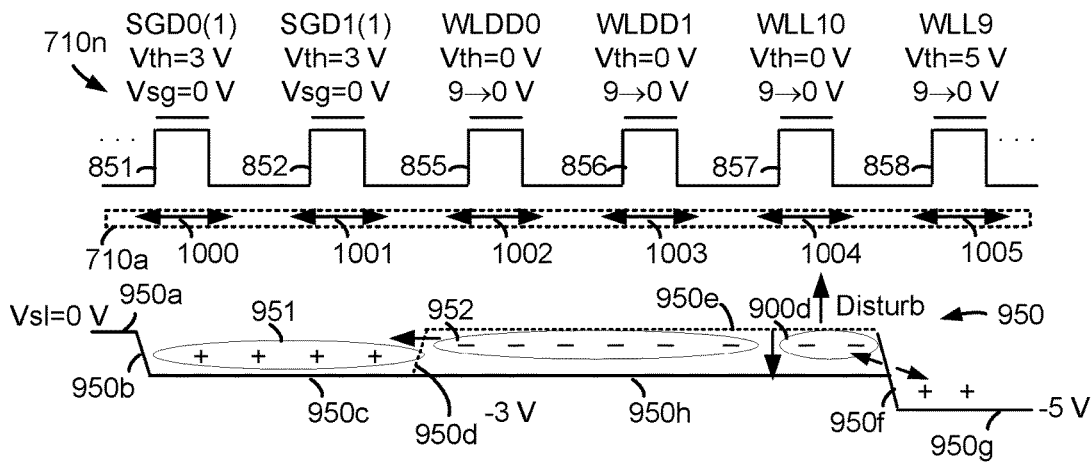
FIG. 10B depicts a plot of a channel voltage versus memory string position for an unselected string after the scenario in FIG. 10A, when the voltages are ramped down on the selected and unselected word lines.

In FIGS. 10A and 10B, a portion of the memory string 710n and its channel 710a of FIGS. 7 and 8 is depicted. The portion of the memory string shown includes the SGD transistors 851 and 852 connected to SGD0(1) and SGD1(1), respectively, the dummy memory cells 855 and 856 connected to WLDD0 and WLDD1, respectively, and the data memory cells 857 and 858 connected to WLL10 and WLL9, respectively. The remaining data memory cells and the SGS transistor extend to the right in the figure. The channel voltage waveforms in FIGS. 10A and 10B can be a mirror image with respect to the drain and source ends, in one approach.

The problem of read disturb occurs in the unselected memory strings of the unselected sub-block. The disturb can be accumulated over time as read stress accumulates in a block or sub-block. In the unselected memory string 710n, the SGD transistors 851 and 852 are adjacent to channel portions 1000 and 1001, respectively. The dummy memory cells 855 and 856 are adjacent to channel portions 1002 and 1003, respectively. The data memory cells 857 and 858 are adjacent to channel portions 1004 and 1005, respectively.

A plot 940 represents a magnitude of the channel voltage for the different channel portions. A plot portion 940a shows that the voltage is 0 V at the drain end. A plot portion 940c shows that the voltage is −3 V adjacent to the SGD transistors. A plot portion 940e shows that the voltage is 0 V adjacent to the dummy memory cells 845 and 846 and the data memory cell 847. Plot portions 940b and 940d represent channel gradients. These gradients are relatively small and do not lead to read disturb.

The control gate voltage is 0 V for the select gate transistors (Vsg=0 V) for the unselected sub-block. As a result, the channel voltage is −3 V adjacent to the SGD transistors. The channel gradients represented by the plot portions 940b and 940d are sufficient to generate electron-hole pairs in the channel. The holes are denoted by "+" and the electrons are denoted by "−". Moreover, since the select gate transistors are typically kept in the non-conductive state throughout the sensing process, when the select gate transitions as described herein are not used, the electron-hole pairs can be generated over a relatively long time, compared to the case of FIG. 9B. As a result, the holes will accumulate in the channel portions 1000 and 1001 adjacent to the SGD transistors. A similar situation can exist at the source end of the memory strings in the unselected sub-block, where the holes will accumulate in a channel portion adjacent to the SGS transistor. Further, the holes can be trapped in shallow traps in the channel.

FIG. 10B depicts a plot of a channel voltage versus memory string position for an unselected string after the scenario in FIG. 10A, when the voltages are ramped down on the selected and unselected word lines. This situation can be compared with the situation in FIG. 9C and corresponds to the time period t12-t13 in FIG. 15A to 15G.

A plot 950 represents a magnitude of the channel voltage for the different channel portions. A plot portion 950a shows that the voltage is 0 V at the drain end. A plot portion 950c shows that the voltage is −3 V adjacent to the SGD transistors, as in FIG. 10A. The channel voltage adjacent to the cells 855-857 transitions from 0 V (plot 950e) to −3 V (plot 950h). Plot portion 950b represents a gradient which is relatively small and does not lead to read disturb. However, the plot portion 950f represent a significant channel gradient of about 5 V which leads to some read disturb of the drain-edge data memory cell 857 of WLL10.

A similar situation can exist at the source end of the memory strings in the unselected sub-block, where a significant channel gradient can be created between the source-end data memory cell of WLL0 and the adjacent memory cell of WLL1.

Note that the gradient 950f can occur in different locations along the channel 710. In one approach, the gradient occurs between one or more consecutive memory cells which remain conductive when the word line voltages are ramped down (e.g., cells 855-857) and a memory cell which becomes non-conductive when the word line voltages are ramped down (e.g., cell 858). For instance, assume the cells are programmed randomly among four data states, and that the cells in the erased state remain conductive when the word line voltages are ramped down and the cells in the programmed states A-C become non-conductive when the word line voltages are ramped down. For a given string in an unselected sub-block, there is a 75% chance that the cell connected to WLL10 is non-conductive when the word line voltages are ramped down. In this case, the gradient will be between the cells 856 and 857, causing disturb of the dummy cell 856. However, this disturb is acceptable since data is not corrupted. If the cell connected to WLL10 is conductive and the cell connected to WLL9 is non-conductive when the word line voltages are ramped down, the gradient will be between the cells 857 and 858, causing disturb of the data cell 857. Similarly, if the cells connected to WLL10 and WLL9 are conductive and the cell connected to WLL8 is non-conductive when the word line voltages are ramped down, the gradient will be between the cells of WLL9 and WLL8, causing disturb of the data cell on WLL9. It can therefore be seen that the probability of disturb is greater for cells closer to the edge of the string and that the edge data cells are the data cells which are most likely to be disturbed. Further, the disturb can occur regardless of the position of the selected word line.

When the voltages of the selected and unselected word lines ramp down, electrons in the channel tend to move toward the select gate transistors, e.g., the SGD transistors, and recombine with the accumulated holes. For example, a group of electrons 952 can recombine with a group of holes 951. This slows down the decrease in the channel potential under the dummy memory cells and the drain-edge data memory cell. The significant gradient represented by the plot 950f is therefore maintained for a relatively longer period of time so that read disturb can occur. Due to the gradient, a group of electrons 900d is generated which can be drawn into the charge trapping region of the memory cell 857.

The read disturb for a single sensing processes is small but the effects are accumulated over many sensing processes. See also FIGS. 18A and 18B, which shows how the channel potential under the drain-edge data memory cell decreases more slowly for the unselected block (plot 1801) versus the selected block (plot 1800) when the word line voltages are ramped down at the end of a sensing process.

FIG. 11A depicts an example threshold voltage (Vth) distribution of a set of memory cells connected to a selected word line after a programming operation, where four data states are used. A Vth distribution 1100 is provided for erased (Er) state memory cells. Three Vth distributions 1110, 1112 and 1114 represent assigned data states A, B and C, respectively, which are reached by memory cells when their Vth exceeds the verify voltage VvA, VvB or VvC, respectively. This example uses four data states. Other numbers of data states can be used as well, such as eight or sixteen. Read voltages VrA, VrB and VrC are used to read data from a set of cells having this Vth distribution. These verify voltages and read voltages are examples of control gate read levels of the selected word line voltage.

During a programming operation, the final Vth distribution can be achieved by using one or more programming passes. Each pass may use incremental step pulse programming, for instance. During a programming pass, program loops are performed for a selected word line. A program loop comprises a program portion in which a program voltage is applied to the word line followed by a verify portion in which one or more verify tests are performed. Each programmed state has a verify voltage which is used in the verify test for the state.

A single-pass programming operation involves one sequence of multiple program-verify operations (or program loops) which are performed starting from an initial Vpgm level and proceeding to a final Vpgm level until the threshold voltages of a set of selected memory cells reach the verify voltages of the assigned data states. All memory cells may initially be in the erased state at the beginning of the programming pass. After the programming pass is completed, the data can be read from the memory cells using read voltages which are between the Vth distributions. At the same time, a read pass voltage, Vread pass (e.g., 9 V), also referred to as Vread, is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

Moreover, the data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB.

FIG. 11B depicts an example Vth distribution of the set of memory cells of FIG. 11A, showing the effects of read disturb. The sub-block which has been programmed as in FIG. 11A now becomes an unselected sub-block which is subject to read disturb as other sub-blocks are subject to read stress by repeated read or programming operations. The plot 1100a represent the erased state Vth with a relatively small amount of read disturb, such as seen by a sub-block with relatively low read stress, and the plot 1100b represent the erased state Vth with a relatively large amount of read disturb, such as seen by a sub-block with relatively high read stress. Read stress can be measured by the number of times a sub-block or block has been subject to a sensing process such as in a read or program operation, for instance. The Vth distribution is for the worst case of an edge data word line.

In a test in which only one sub-block was subject to read stress, the read disturb was generally not seen on that sub-block but was seen on the other, unselected sub-blocks. In practice, as different sub-blocks are read, they will have a similar amount of read stress so that the read disturb will be seen on all sub-blocks. The disturb-reducing techniques described herein can limit the upshift in the Vth distribution so that only a relatively small amount of read disturb is seen.

FIG. 12 depicts an example Vth distribution of a set of memory cells connected to a selected word line after a programming operation, where eight data states are used. Single-pass or multi-pass programming may be used to obtain this Vth distribution. Based on the write data as indicated, the cells which are to remain in the Er state are represented by the Vth distribution 1200. The cells which are to be programmed to the A, B, C, D, E, F and G states using verify voltages of VvA, VvB, VvC, VvD, VvE, VvF and VvG, respectively, are represented by the Vth distributions 1201, 1202, 1203, 1204, 1205, 1206 and 1207, respectively. Each data state represents three bits of data as indicated. Read voltages VrA, VrB, VrC, VrD, VrE, VrF and VrG can be used for reading the states of the cells in a read operation. These verify voltages and read voltages are examples of control gate read levels of the selected word line voltage. Other example programming operations may use additional data states and/or programming passes. For example, sixteen data state are possible.

With eight data states, or three bits per cell, three pages of data can be stored. An example encoding of bits for the A, B, C, D, E, F and G states is 111, 110, 100, 000, 010, 011, 001 and 101, respectively. The data of the lower page can be determined by reading the memory cells using read voltages of VrA and VrE. The data of the middle page can be determined by reading the memory cells using read voltages of VrB, VrD and VrF. The data of the upper page can be determined by reading the memory cells using read voltages of VrC and VrG.

Figure 13A:
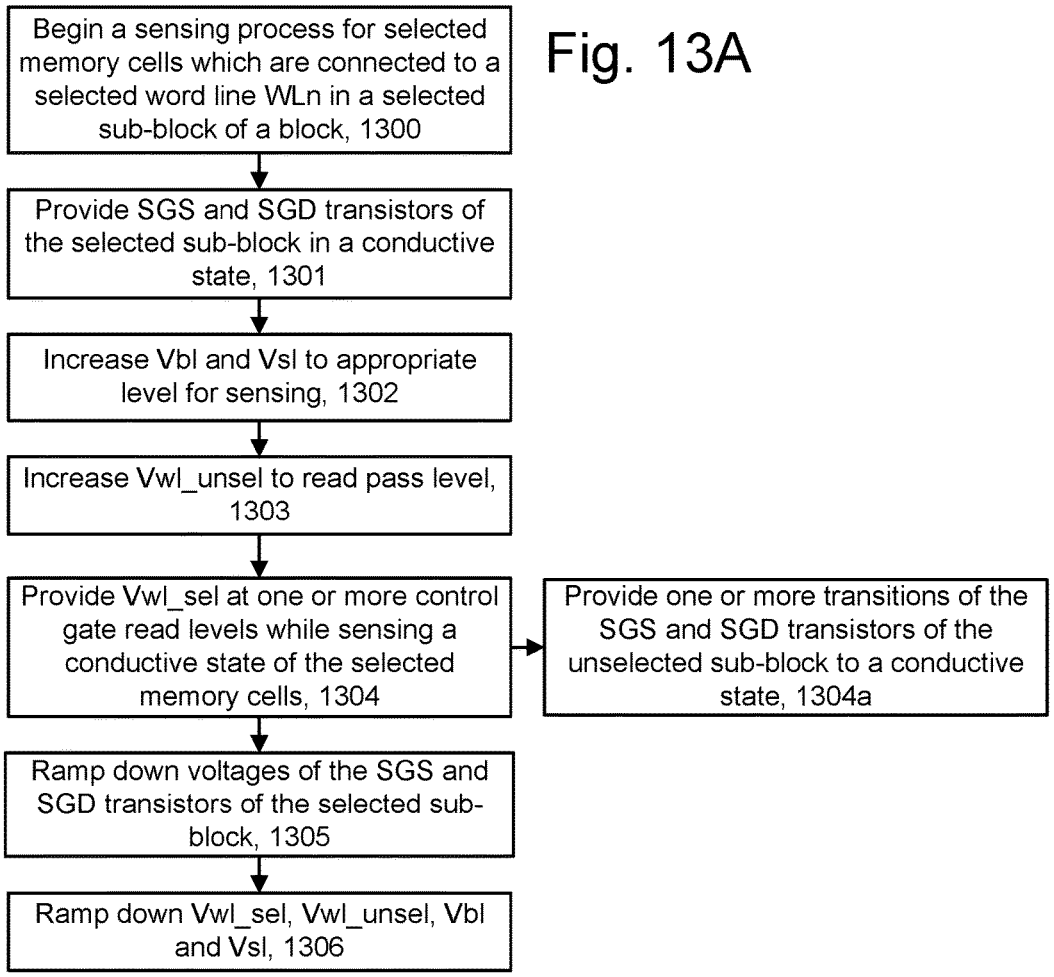
FIG. 13A depicts a flowchart of an example sensing process which reduces read disturb.

FIG. 13A depicts a flowchart of an example sensing process which reduces read disturb. A sensing process can occur, e.g., as a verify test in a programming operation, where the verify test determines whether the Vth of a cell exceeds a verify voltage of its assigned data state, or in a read operation which involves ascertaining the data state of a memory cell (after it has been programmed) by determining a highest read voltage which results in the memory cell being in a non-conductive state and/or a lowest read voltage which results in the memory cell being in a conductive state. A sensing process can involve applying one or more voltages to a selected word line while sensing whether the associated memory cells are in a conductive or non-conductive state.

Step 1300 begins a sensing process for selected memory cells which are connected to a selected word line WLn in a selected sub-block of a block. For example, in FIG. 8, assume SB0 is the selected sub-block and SB1-SB3 are unselected sub-blocks. Step 1301 includes providing the SGS and SGD transistors of the selected sub-block in a conductive state. For example, see FIG. 15C.

Step 1302 includes increasing the bit line Vbl and the source line voltage Vsl to appropriate levels for sensing. For example, see FIGS. 15F and 15G.

Step 1303 includes increasing a voltage of unselected word lines of the block (Vwl_unsel) from an initial level to a read pass level. For example, see FIG. 15B.

Step 1304 includes providing the voltage of the selected word line (Vwl_sel) at one or more control gate read levels while sensing a conductive state of the selected memory cells. At step 1304a, this can include providing one or more transitions of the SGS and SGD transistors of the unselected sub-block to a conductive state. For example, see FIGS. 15D and 15E. The transition is from a non-conductive state to a conductive state and back to the non-conductive state. Providing a transistor in a conductive state can involve applying a control gate voltage which exceeds the Vth of the transistor, plus a margin. Providing a transistor in a non-conductive state can involve applying a control gate voltage which does not exceeds the Vth of the transistor.

Step 1305 includes ramping down the voltages of the SGS and SGD transistors of the selected sub-block. For example, see FIG. 15C.

Step 1306 includes ramping down Vwl_sel, Vwl_unsel, Vbl and Vsl from their elevated levels to a lower level such as 0 V. For example, see FIGS. 15A, 15B, 15F and 15G.

The steps depicted are not necessarily performed sequentially in the order shown. Instead, some steps can overlap, such as depicted in FIG. 15A to 15G. Moreover, one or more unselected sub-blocks in a block may be controlled using the process. Further, the transitioning of the select gate transistors can involve the SGS and/or SGD transistors. The select gate transistors which are not transitioned, if applicable, can remain at 0 V, for instance, during the sensing process.

A further option is to omit the transitioning of the select gate transistors when the unselected sub-blocks are not programmed. Based on a word line and sub-block programming order, it is possible that the cells of an unselected sub-block will all be in an erased state. In this case, the likelihood of read disturb of the data cells at the edge word lines is reduced, because the gradient of plot 950f in FIG. 10B will not be seen. Omitting the transitioning can reduce the power consumption of the memory device and potentially reduce the time for the sensing process. Or, the transitioning can be reduced for an erase sub-block. For example, the on-time of the transition or the number of transitions in a sensing process can be reduced for an erased sub-block versus a programmed sub-block. This can also help reduce the power consumption.

In one approach, the select gate control circuit associated with the unselected sub-block is configured to provide the one or more transitions in response to a determination that the unselected sub-block comprises programmed memory cells, e.g., cells in a state higher than the erased state.

Figure 13B:
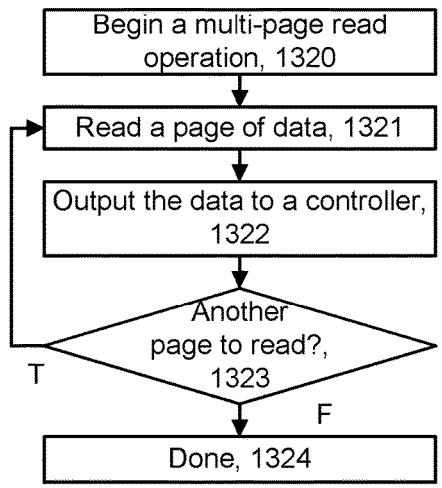
FIG. 13B depicts a flowchart of an example multi-page read operation which can use the sensing process of FIG. 13A.

FIG. 13B depicts a flowchart of an example multi-page read operation which can use the sensing process of FIG. 13A. As an example, with four data states as in FIG. 11, one page may be read using VrA and VrC and another page may be read using VrB. The read data from each pages is output from the sense circuits to the controller, in one approach. Step 1320 begins a multi-page read operation. Step 1321 includes reading a page of data, such as by using the process of FIG. 13A. Step 1322 includes outputting the data to a controller. If a decision step 1323 determines that there is another page to read, step 1321 is repeated. If the decision step 1323 determines that there is no further page to read, the read operation is done at step 1324.

FIG. 13C depicts a flowchart of an example programming process which can use the sensing process of FIG. 13A when performing verify tests. Step 1330 begins a program operation or pass. In one approach, a programming operation comprise one or more program passes. Step 1331 sets an initial program voltage (Vpgm). See, e.g., FIG. 14 and Vpgm_init. Step 1332 begins a program loop.

Step 1333 applies the program voltage to a selected word line and a voltage at a read pass level to unselected word lines (e.g., unselected data and dummy word lines). The selected word line could be one of WL0-WL10 in FIG. 7 or 8, for instance. This step also includes setting a program or inhibit status for the memory cells connected to the selected word line. A cell with an inhibit status has the associated bit line of the memory string set to a high level, e.g., 2-3 V which inhibits programming. A cell with a program status has the associated bit line of the memory string set to a low level, e.g., 0 V which allows programming. Step 1334 ramps down the voltages of the word lines.

Step 1335 includes performing a sensing process, e.g., one or more verify tests, for the selected memory cells. For example, the process of FIG. 13A may be used. This can involve applying a voltage at one or more control gate read levels to the selected memory cells via the selected word line while applying a voltage at a read pass level to unselected word lines while sensing the memory cells. The sensing of a memory cell can involve detecting a level of a current in the associated memory string. See also FIG. 15F. The verify test determines whether each selected memory cell is in a conductive or non-conductive state. If decision step 1336 is true, the program operation or pass is completed at step 1338. If the decision step 1336 is false, step 1337 increments Vpgm and another program loop begins at step 1332. In a given program loop, a verify test may be performed for one or more assigned data states. For each assigned data state, the corresponding verify test is passed if all, or nearly all, of the memory cells which have the assigned data state pass the verify test. For example, the verify test may be passed if all, or nearly all, of the memory cells which have the assigned data state have a Vth greater than the control gate read level. This may be indicated by a current in the memory string exceeding a specified level as measured by a decay in the bit line voltage. See FIG. 15F.

A pulse train typically includes program pulses which increase stepwise in amplitude in one or more program loops or program loops of a programming pass using a fixed or varying step size. In some cases, the program pulses increase in each program loop after the first. A new pulse train can be applied in each programming pass, starting at an initial level and ending at a final level which does not exceed a maximum allowed level. The initial levels can be the same or different in different programming passes. The final levels can also be the same or different in different programming passes. The step size can be the same or different in the different programming passes. In some cases, a smaller step size is used in a final programming pass to reduce Vth distribution widths.

FIG. 14 depicts a series of program loops in an example programming operation, consistent with FIG. 13C. The pulse train 1400 includes a series of program pulses 1401-1415 that are applied to a word line selected for programming. The pulse train 1400 is an example of a second set of step-wise increasing program voltages. Vpgm_init is the initial program voltage. One, two or three verify pulses are provided after each program pulse as an example, based on the assigned data states which are being verified. For example, an A-state verify pulse 1420 (VvA) is applied in program loops 1-3, A-state and B-state verify pulses 1421 (VvA and VvB, respectively) are applied in program loops 4-6, A-state, B-state and C-state verify pulses 1422 (VvA, VvB and VvC, respectively) are applied in program loops 7 and 8, B-state and C-state verify pulses 1423 are applied in program loops 9-11, and a C-state verify pulse 1424 is applied in program loops 12-15.

FIG. 15A to 15G depicts example plots of voltages used in the sensing process of FIG. 13A. A common time line on a horizontal axis is used in these figures while the vertical axis in each figure represents a voltage.

FIG. 15A depicts an example plot 1500 of a voltage on a selected word line, Vwl_sel. In this example, the sensing process is a read operation of a page of data which uses control gate read levels of VrA and VrC, consistent with the four-state example of FIG. 11A. Generally, one or more control gate read levels may be used in a sensing process. The voltage is initially at 0 V and is set to VrA at t4-t6, Vrc from t6-t9, Vread pass from t9-t12 and then ramped down to 0 V at t12-t13. VrA can be about 0-0.5 V in some examples, while VrC might be about 4 V. Optionally, as shown, after the sensing occurs at the two control gate read levels of VrA and VrC, Vwl_sel is increased to Vread pass before ramping it down to 0 V at the same time Vwl_unsel is ramped down (FIG. 15B) to further help reduce channel gradients and associated disturbs.

FIG. 15B depicts an example plot 1510 of a voltage on unselected word lines, Vwl_unsel. Vwl_unsel is increased or ramped up from t0-t3 from 0 V to Vread pass, e.g., 9 V, for instance. Vwl_unsel is sufficiently high to provide the associated memory cells in a conductive state. In one approach, Vwl_unsel is increased based on a control signal to a voltage driver which changes the requested output of the voltage driver in a step change. In another approach, Vwl_unsel is increased based on a control signal to a voltage driver which changes the requested output of the voltage driver more gradually, in a ramp. Vwl_unsel is maintained at Vread pass until t12 when it is ramped back down to 0 V.

FIG. 15C depicts an example plot 1520 of a voltage on SGD and SGS transistors in a selected sub-block, Vsgd_sel and Vsgs_sel, respectively (also referred to as Vsgd/sgs_sel). These transistors may be provided in a conductive state throughout the sensing process. This allows the currents to be sensed in the memory strings of the selected sub-block using the sensing circuits.

FIG. 15D depicts an example plot 1530 of a voltage on SGD and SGS transistors in an unselected sub-block, Vsgd_unsel and Vsgs_unsel (also referred to as Vsgd/sgs_unsel), respectively, where three transitions to a conductive state are used. Transitions 1530a, 1530b and 1530c extend from t1-t2, t6-t7 and t9-t10, respectively, as an example. The transition waveforms can be considered to be voltage spikes or pulses as they are relatively short in duration, in one approach, compared to the duration of the sensing process (t0-t13). As mentioned, a goal of the transitions is to remove holes which accumulate in the channel adjacent to the select gate transistors at the ends of the memory strings in the unselected sub-blocks. By selectively increasing Vsgd_unsel and Vsgs_unsel for short periods during the sensing process, e.g., during the time in which the voltage at one or more control gate read levels is applied to the selected word line, the accumulation of holes can be reduced by allowing the holes to move toward the bit line or source line.

One approach is to periodically transition the select gates during the sensing process. Periodically refers to occasionally or from time to time and does not require a fixed period between transitions. The transitions can be spaced apart roughly equally in one approach. The transitions should be timed to avoid interfering with the sensing process of the selected sub-block. For example, t5-t5a and t8-t8a may be time periods used for sensing of the memory strings in the selected sub-block at the control gate read levels of VrA and VrC, respectively. The transitions are avoided in these time periods.

Note that the initial transition 1530a serves the purpose of reducing the channel boosting of the memory strings in the unselected sub-blocks, rather than the purpose of removing holes since the holes would not yet have time to accumulate. Such boosting is caused by capacitive coupling from the unselected word lines to the channels when Vwl_unsel increases from 0 to 9 V, for instance. One option is to omit the transition 1530a and keep the two remaining transitions.

A convenient time to position the transitions is when the control gate read voltage changes, e.g., from VrA to VrC, and from VrC to Vread pass. This is shown in FIG. 15B by placing the start of the transitions at t6 and t9. Note that the SGD_unsel and SGS_unsel transistors will be conductive for a time period which is shorter than the overall time period of the transition. This is because some time is need to increase the control gate voltage from 0 V to above the Vth, and to decrease the control gate voltage from Vth to 0 V. See also FIGS. 17A and 17B.

Various options are possible regarding the placement and on-time of the transitions. The on-time is the time period during the transition in which the SGD_unsel and SGS_unsel transistors are conductive. One option is to have transitions with different on-times. Another option is to have three or more transitions with different delays between them. A situation should be avoided in which the select gate transistors are in the conductive state while the voltages of the data word lines ramp down. This helps avoid FN type read disturb. Generally, the last transition during a sensing process, e.g., during one or more control gate voltage levels, should be completed before the voltages of the data word lines ramp down, including the voltages of the selected and unselected word lines.

The magnitude of the transition waveform can be sufficiently high to provide the select gate transistor in a conductive state. In one example, the magnitude of Vsgd_unsel/Vsgs_unsel is 4 V and the Vth of the select gate transistors is 3 V.

By providing the SGD_unsel and SGS_unsel in a conductive state for one or more brief periods during a sensing operation, injection type read disturb such as described in connection with FIGS. 10A and 10B can be reduced without impairing the sensing process for the selected sub-block and without increasing FN type disturb.

In one approach, the one or more control gate read levels comprise a plurality of control gate read levels (e.g., VrA and VrC), and the select gate control circuit 119 is configured to provide a last transition (e.g., transition 1530c) of one or more transitions (e.g., transitions 1530a, 1530b and 1530c) after sensing of memory strings in the selected sub-block at a last control gate read level (e.g., VrC) of the plurality of control gate read levels.

FIG. 15E depicts an example plot 1540 of a voltage on SGD and SGS transistors in an unselected sub-block, Vsgd_unsel and Vsgs_unsel, respectively, where one transition 1540a to a conductive state is used. One transition during the sensing process is sufficient to remove a significant portion of the accumulated holes and to reduce the read disturb.

FIG. 15F depicts an example plot 1550 of a voltage on a bit line, Vbl. A steady state voltage, e.g., 0 V, is applied initially, and a sensing voltage, Vbl_sense, e.g., 2-3 V, is applied from t1-t12. Sensing of the memory cells occurs at a time period beginning at t5 and t8. During sensing of the memory string, for each control gate read voltage, Vbl may remain relatively steady or may decay. The case with a bit line decay is depicted by plots 1550a and 1550b. If Vbl decays below a specified trip level, the selected memory string is considered to be in a conductive state and the Vth of the selected memory cell is below the demarcation voltage. If Vbl does not decay below the trip point, the selected memory string is considered to be in a non-conductive state and the Vth of the selected memory cell is equal to or above the demarcation voltage. Note that the bit lines are common in the selected and unselected sub-blocks.

FIG. 15G depicts an example plot 1560 of a voltage on a source line, Vsl. The source line is common in the selected and unselected blocks, in one approach. In one approach, Vsl remains at a steady state voltage such as 0 V throughout the sensing process. Optionally, Vsl is provided at an elevated level such as 0.5 V during sensing.

Figure 16A:
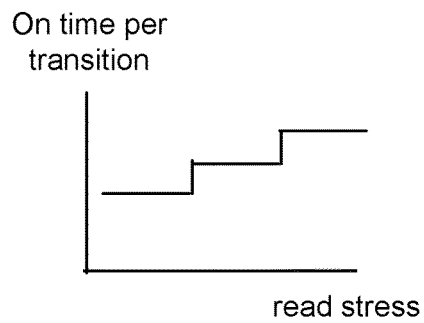
FIG. 16A depicts a plot of an on-time per transition versus an amount of read stress in a block or sub-block, such as for any of the transitions of FIGS. 15D and 15E.

FIG. 16A depicts a plot of an on-time per transition versus an amount of read stress in a block or sub-block, such as for any of the transitions of FIGS. 15D and 15E. As mentioned, the amount of read disturb is correlated with the amount of read stress. As a block or sub-block undergoes more read cycles, the amount of program disturb increases. Accordingly, a stronger countermeasure can be provided as read stress increases. One approach is to increase the on-time of the transitions as read stress increases.

In one approach, a select gate control circuit associated with the unselected sub-block is configured to provide at least some of the select gate transistors in the unselected sub-block in the conductive state during the one or more transitions throughout a time period which is a function of an amount of read stress for the plurality of memory strings; and the time period is greater when the amount of read stress is greater.

Figure 16B:
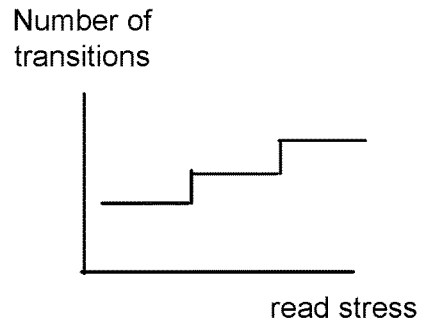
FIG. 16B depicts a plot of a number of transitions versus an amount of read stress in a block or sub-block.

FIG. 16B depicts a plot of a number of transitions versus an amount of read stress in a block or sub-block. Another possible approach to read disturb which increases with read stress is to increase the number of transitions for the select gates in each sensing process. The controller can be configured to track the read stress in a block, for instance, by incrementing a counter for each sensing process.

In one approach, the select gate control circuit associated with the unselected sub-block is configured to provide a number of the transitions which is a function of an amount of read stress for the plurality of memory strings; and the number is greater when the amount of read stress is greater.

Figure 17A:
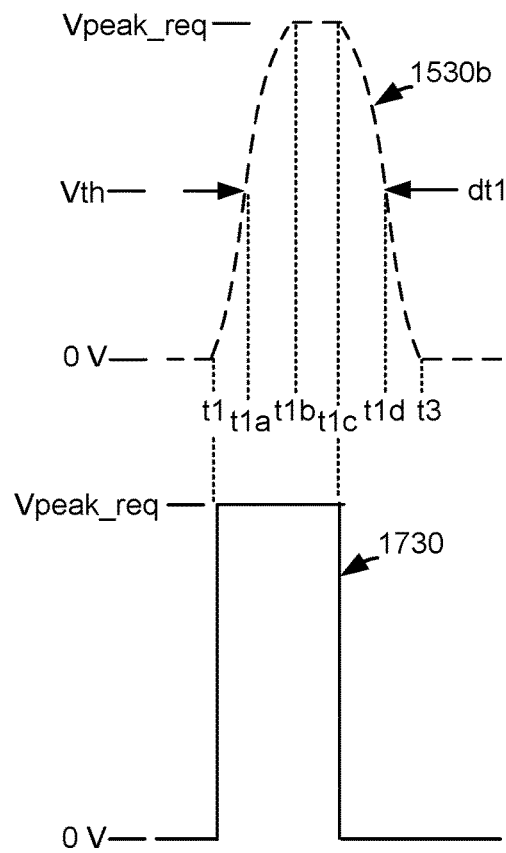
FIG. 17A depicts a close up view of the transition 1530a in FIG. 15D, where Vsgd/Vsgs_unsel reaches a peak requested level of Vpeak_req, and a plot of a corresponding control signal 1730 for a voltage driver.

FIG. 17A depicts a close up view of the transition 1530a in FIG. 15D, where Vsgd/Vsgs_unsel reaches a peak requested level of Vpeak_req, and a plot of a corresponding control signal 1730 for a voltage driver. A control signal can be provided to a voltage driver for the unselected select gate transistors in each unselected sub-block to provide a corresponding output Vsgd/Vsgs_unsel of plot 1530b for a transition. The control signal can be provided with a step change from an initial level such as 0 V to a requested peak level (Vpeak_req, e.g., 4 V). The time points of t1 and t3 here are consistent with FIG. 15E. Additional intermediate time points t1a-t1d are also depicted. Before t1, the control signal requests an output of 0 V. At t1, the control signal first requests an output of Vpeak_req. Between t1-t1c, the control signal continues to request Vpeak_req. At t1c, the control signal again requests the output of 0 V and this request is maintained after t1c.

The output voltage Vsgd/Vsgs_unsel is delayed relative to the requested level. Plot 1530b shows that Vsgd/Vsgs_unsel increases above the Vth of the select gate transistors at t1a, at which time the select gate transistors of the unselected sub-blocks transition to the conductive state from the non-conductive state. Vsgd/Vsgs_unsel continues to increase from t1a-t1b until it reaches Vpeak_req at t1b. Vsgd/Vsgs_unsel is maintained at Vpeak_req from t1b-t1c, and begins to decrease at t1c. Vsgd/Vsgs_unsel decreases from Vpeak_req to Vth from t1c-t1d. When Vsgd/Vsgs_unsel decreases below Vth at t1d, the select gate transistors of the unselected sub-blocks transition to the non-conductive state from the conductive state. The select gate transistors are therefore conductive from t1a-t1d in a time period of dt1. Vsgd/Vsgs_unsel continues to decrease until t3.

In one approach, the select gate control circuit 119 is associated with the unselected sub-block, and to provide one or more transitions, it is configured to vary a control gate voltage of the at least some of the select gate transistors in the unselected sub-block from one level to another higher level and back to the one level. The one level, e.g., 0 V, is less than a threshold voltage of the at least some of the select gate transistors in the unselected sub-block; and the another level, e.g., Vpeak_req such as 4 V, is greater than the threshold voltage.

Figure 17B:
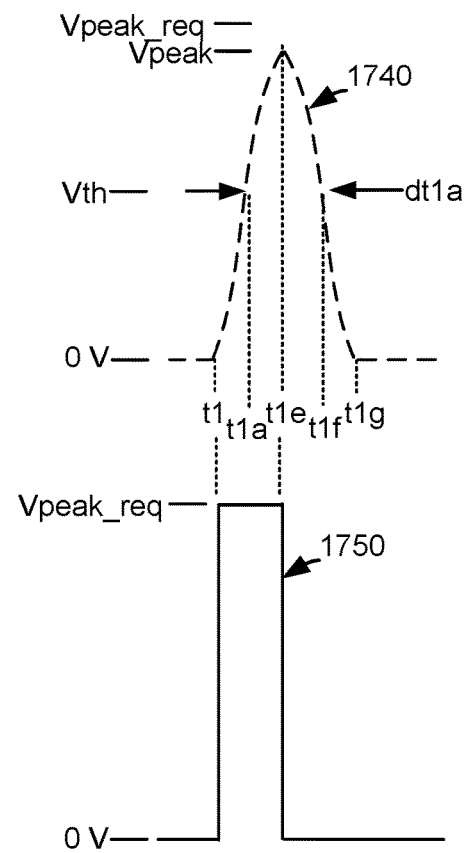
FIG. 17B depicts an alternative case of a transition 1740 of Vsgd/Vsgs_unsel, where Vsgd_unsel does not reach a peak requested level of Vpeak_req, and a plot 1750 of a corresponding control signal for a voltage driver.

FIG. 17B depicts an alternative case of a transition 1740 of Vsgd/Vsgs_unsel, where Vsgd/Vsgs_unsel does not reach a peak requested level of Vpeak_req, and a plot 1750 of a corresponding control signal for a voltage driver. In this example, the amount of time in which Vpeak_req is requested by the control signal (e.g., t1-t1e) is not sufficient for Vsgd/sgs_unsel to reach Vpeak_req. However, the amount of time in which Vpeak_req is requested is sufficient for Vsgd/sgs_unsel to reach Vth and enter the conductive state. Specifically, before t1, the control signal requests an output of 0 V. At t1, the control signal first requests an output of Vpeak_req. Between t1-t1e, the control signal continues to request Vpeak_req. At t1e, the control signal again requests the output of 0 V and this request is maintained after t1e.

Plot 1740 shows that Vsgd/Vsgs_unsel increases above the Vth of the select gate transistors at t1a, at which time the select gate transistors of the unselected sub-blocks transition to the conductive state from the non-conductive state. Vsgd/Vsgs_unsel continues to increase from t1a-t1e until it reaches a peak level of Vpeak, which is less than Vpeak_req, at t1e. Vsgd/Vsgs_unsel begins to decrease at t1e. Vsgd/Vsgs_unsel decreases from Vpeak to Vth from t1e-t1f. When Vsgd/Vsgs_unsel decreases below Vth at t1f, the select gate transistors of the unselected sub-blocks transition to the non-conductive state from the conductive state. Vsgd/Vsgs_unsel continues to decrease until t1g. The select gate transistors are therefore conductive from t1a-t1f in a time period of dt1a.

Figure 18A:
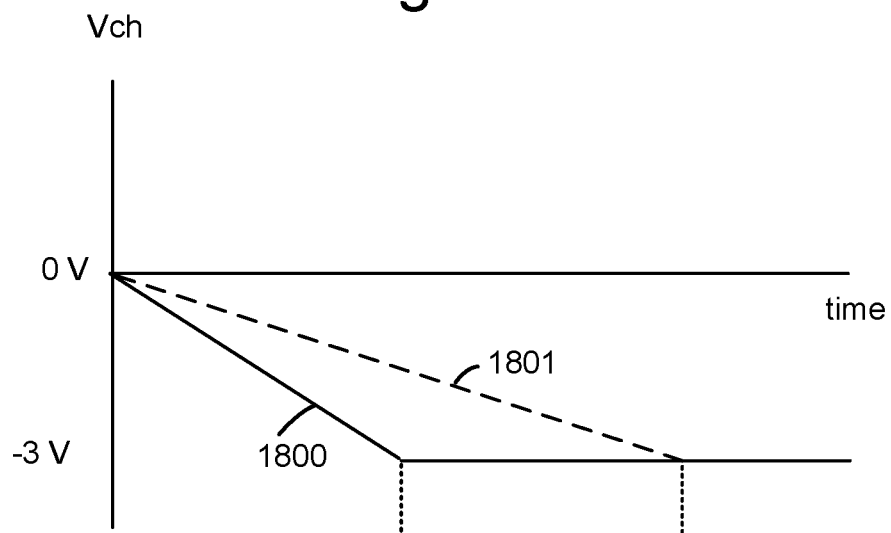
FIG. 18A depicts a plot of channel voltage under edge word lines versus time during the ramp down of Vwl_unsel in FIG. 15B, for a selected string (plot 1800) and an unselected string (plot 1801).
Figure 18B:
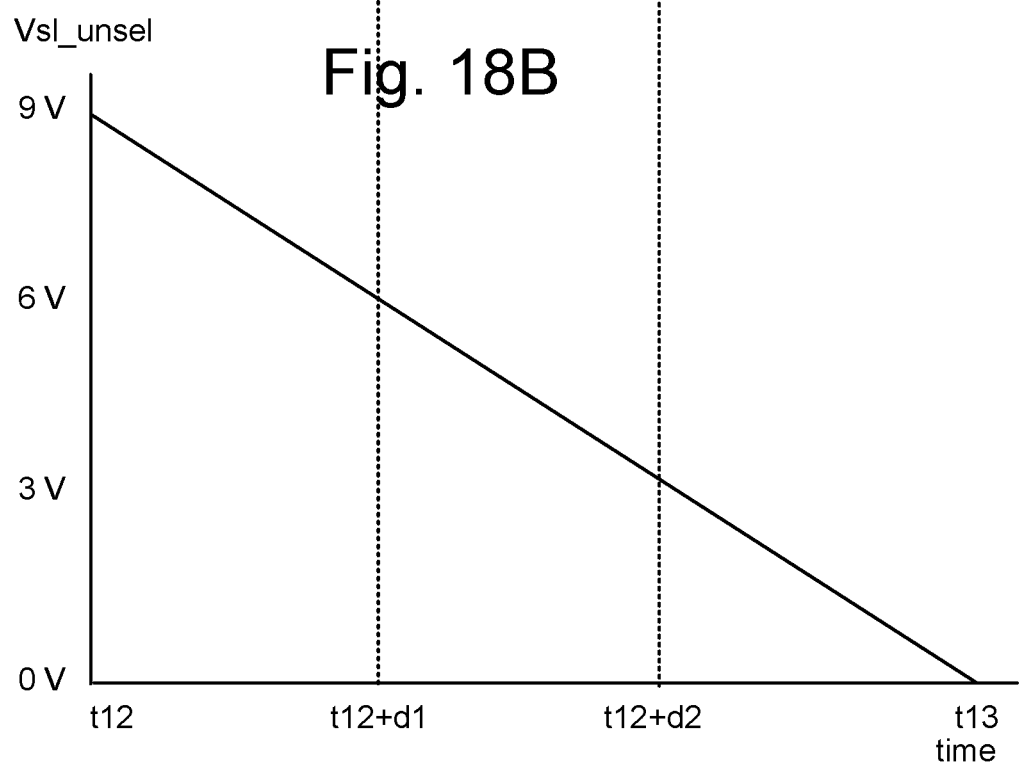
FIG. 18B depicts a plot of the ramp down of Vwl_unsel in plot 1510 of FIG. 15B between t12 and t13, time aligned with FIG. 18A.

FIG. 18A depicts a plot of channel voltage under edge word lines versus time during the ramp down of Vwl_unsel in FIG. 15B, for a selected string (plot 1800) and an unselected string (plot 1801). The channel voltage Vch may be for the region between the transistor 858 and the select gate transistor 852 in FIG. 10B, for instance. This is the voltage which results in the disturb-inducing gradient 950f. Accordingly, the slower the decrease of Vch, the larger the amount of read disturb. At a time t12, the ramp down of Vwl_unsel starts and Vch is at 0 V. At a time t12+d1 (delta1), Vwl_unsel falls to 6 V and Vch decreases to −3 V or −2 V in plot 1800 or 1801, respectively. At a time t12+d2 (delta2), Vwl_unsel falls to −3 V in plot 1801. The extra time d2-d1 is a time in which additional read disturb occurs when the countermeasures described herein are not used. When the select gate transitions are used, the Vch is closer to the plot 1800 than the plot 1801

FIG. 18B depicts a plot of the ramp down of Vwl_unsel in plot 1510 of FIG. 15B between t12 and t13, time aligned with FIG. 18A. As a simplification, Vwl_unsel decreases to different voltages in a ramp which correlates with different levels of Vch in FIG. 18A.

In one implementation, an apparatus comprises: a plurality of memory strings arranged in a selected sub-block and an unselected sub-block, each memory string comprising select gate transistors and memory cells between the select gate transistors; a plurality of word lines connected to the memory cells; an unselected word line control circuit configured to apply a voltage at a read pass level to unselected word lines among the plurality of word lines; a selected word line control circuit configured to apply a voltage at one or more control gate read levels to a selected word line among the plurality of word lines; and a select gate control circuit associated with the unselected sub-block, configured to provide one or more transitions of at least some of the select gate transistors in the unselected sub-block from a non-conductive state to a conductive state and back to the non-conductive state while the voltage at the one or more control gate read levels is applied on the selected word line and while the voltage at the read pass level is applied to the unselected word lines.

In another implementation, a method comprises: concurrently, applying a voltage at a read pass level to unselected word lines among a plurality of word lines and applying a voltage at one or more control gate read levels to a selected word line among the plurality of word lines; sensing selected memory cells connected to the selected word line during each control gate read level of the one or more control gate read levels, wherein the selected memory cells are arranged in selected memory strings and unselected memory cells are arranged in unselected memory strings, each memory string comprising a channel; and periodically discharging the channels of the unselected memory strings during the voltage at the one or more control gate read levels.

In another implementation, an apparatus comprises: a selected memory string and unselected memory strings, the selected memory strings and unselected memory strings each comprising a source-end select gate transistor, a drain-end select gate transistor and memory cells between the source-end select gate transistor and the drain-end select gate transistor; a set of word lines connected to the memory cells in the selected memory string and the unselected memory strings; means for sensing the memory cells in the selected memory string while a control gate read voltage is applied to a selected word line of the set of word lines and read pass voltages are applied to unselected word lines of the set of word lines; means for providing the drain-end select gate transistors of the selected memory strings in a conductive state during the control gate read voltage; and means for providing the drain-end select gate transistors of the unselected memory strings in a non-conductive state during the control gate read voltage, before and after, but not while, the drain-end select gate transistors of the selected memory strings are in the conductive state.

The means for sensing may include the power control module 116, the selected WL control circuit 115, the unselected WLs control circuit 117, the select gate control circuit 119, the control circuitry 110, the controller 122, the sense block 51, the voltage sources 420 including the SGS drivers 445-445c and the SGD drivers 446-446c, or other logic hardware, and/or other executable code stored on a computer readable storage medium or device. Other embodiments may include similar or equivalent means for sensing.

The means for providing the drain-end select gate transistors of the selected memory strings in a conductive state during the control gate read voltage, and the means for providing the drain-end select gate transistors of the unselected memory strings in a non-conductive state during the control gate read voltage, may include the power control module 116, the select gate control circuit 119, the control circuitry 110, the controller 122, the voltage sources 420 including the SGS drivers 445-445c and the SGD drivers 446-446c, or other logic hardware, and/or other executable code stored on a computer readable storage medium or device. Other embodiments may include similar or equivalent means for sensing.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:
1. An apparatus, comprising:
a plurality of memory strings arranged in a selected sub-block and an unselected sub-block, each memory string comprising select gate transistors and memory cells between the select gate transistors;
a plurality of word lines connected to the memory cells;
an unselected word line control circuit configured to apply a voltage at a read pass level to unselected word lines among the plurality of word lines;
a selected word line control circuit configured to apply a voltage at one or more control gate read levels to a selected word line among the plurality of word lines; and
a select gate control circuit associated with the unselected sub-block, configured to provide one or more transitions of at least some of the select gate transistors in the unselected sub-block from a non-conductive state to a conductive state and back to the non-conductive state while the voltage at the one or more control gate read levels is applied on the selected word line and while the voltage at the read pass level is applied to the unselected word lines.

2. The apparatus of claim 1, wherein:
the select gate control circuit associated with the unselected sub-block, to provide the one or more transitions, is configured to vary a control gate voltage of the at least some of the select gate transistors in the unselected sub-block from one level to another higher level and back to the one level.

3. The apparatus of claim 2, wherein:
the one level is less than a threshold voltage of the at least some of the select gate transistors in the unselected sub-block; and
the another level is greater than the threshold voltage.

4. The apparatus of claim 1, further comprising:
bit lines connected to the plurality of memory strings in the selected sub-block and the unselected sub-block; and
sense circuits connected to the bit lines and configured to sense the memory strings in the selected sub-block via the bit lines during each of the one or more control gate read levels, wherein the one or more transitions do not occur while the sense circuits sense the memory strings in the selected sub-block.

5. The apparatus of claim 1, wherein:
the select gate control circuit is configured to provide one of the transitions after sensing of memory strings in the selected sub-block at one of the control gate read levels and before sensing of memory strings in the selected sub-block at another of the control gate read levels.

6. The apparatus of claim 1, wherein:
the one or more control gate read levels comprise a plurality of control gate read levels; and
the select gate control circuit is configured to provide a last transition of the one or more transitions after sensing of memory strings in the selected sub-block at a last control gate read level of the plurality of control gate read levels.

7. The apparatus of claim 1, wherein:
the select gate control circuit is configured to complete a last transition of the one or more transitions before the unselected word line control circuit ramps down the voltage on the unselected word lines from the read pass level.

8. The apparatus of claim 1, wherein:
the selected word line control circuit is configured to apply a voltage at the read pass level to the selected word line after the voltage at the one or more control gate read levels; and
the select gate control circuit is configured to complete a last transition of the one or more transitions while the voltage at the read pass level is applied to the selected word line.

9. The apparatus of claim 1, wherein:
the select gate control circuit associated with the unselected sub-block is configured to periodically provide the transitions while the voltage at the one or more control gate read levels is applied to the selected word line and while the voltage at the read pass level is applied to the unselected word lines.

10. The apparatus of claim 1, wherein:
the select gate control circuit associated with the unselected sub-block is configured to provide the at least some of the select gate transistors in the unselected sub-block in the conductive state during the one or more transitions throughout a time period which is a function of an amount of read stress for the plurality of memory strings; and
the time period is greater when the amount of read stress is greater.

11. The apparatus of claim 1, wherein:
the select gate control circuit associated with the unselected sub-block is configured to provide a number of the transitions which is a function of an amount of read stress for the plurality of memory strings; and
the number is greater when the amount of read stress is greater.

12. The apparatus of claim 1, wherein:
the at least some of the select gate transistors comprise at least one of source-end select gate transistors and drain-end select gate transistors of memory strings in the unselected sub-block.

13. The apparatus of claim 1, wherein:
the select gate control circuit associated with the unselected sub-block is configured to provide the one or more transitions in response to a determination that the unselected sub-block comprises programmed memory cells.

14. A method, comprising:
concurrently, applying a voltage at a read pass level to unselected word lines among a plurality of word lines and applying a voltage at one or more control gate read levels to a selected word line among the plurality of word lines;
sensing selected memory cells connected to the selected word line during each control gate read level of the one or more control gate read levels, wherein the selected memory cells are arranged in selected NAND strings and unselected memory cells are arranged in unselected NAND strings, each NAND string comprising a channel; and
periodically discharging the channels of the unselected NAND strings during the voltage at the one or more control gate read levels.

15. The method of claim 14, wherein:
the selected NAND strings and the unselected NAND strings each comprise a source-end select gate transistor, a drain-end select gate transistor and memory cells between the source-end select gate transistor and the drain-end select gate transistor; and
the periodically discharging comprises periodically providing at least one of the drain-end select gate transistor and the source-end select gate transistor in the unselected NAND strings in a conductive state.

16. The method of claim 14, further comprising:
providing the drain-end select gate transistor and the source-end select gate transistor in the selected NAND strings in a conductive state throughout a duration of the voltage at the one or more control gate read levels.

17. The method of claim 14, wherein:
the periodic discharging is completed after the sensing and before ramping down the voltage applied to the unselected word lines and ramping down the voltage applied to the selected word line.

18. The method of claim 14, further comprising:
after the sensing, ramping up the voltage applied to the selected word line from the one or more control gate read levels to the read pass level, then ramping down the voltage applied to the selected word line from the read pass level, wherein the periodic discharging is completed after the sensing and before ramping down the voltage applied to the selected word line from the read pass level.

* * * * *